(12) United States Patent
Patel et al.

(10) Patent No.: US 9,766,277 B2
(45) Date of Patent: Sep. 19, 2017

(54) SELF-CALIBRATING CONTACTLESS POWER CONSUMPTION SENSING

(71) Applicant: Belkin International, Inc., Playa Vista, CA (US)

(72) Inventors: Shwetak N. Patel, Seattle, WA (US); Sidhant Gupta, Seattle, WA (US); Matthew S. Reynolds, Seattle, WA (US)

(73) Assignee: BELKIN INTERNATIONAL, INC., Playa Vista, CA (US)

( * ) Notice: Subject to any disclaimer, the term of this patent is extended or adjusted under 35 U.S.C. 154(b) by 320 days.

(21) Appl. No.: 14/485,424

(22) Filed: Sep. 12, 2014

(65) Prior Publication Data
US 2015/0002137 A1   Jan. 1, 2015

Related U.S. Application Data

(60) Continuation-in-part of application No. 12/567,561, filed on Sep. 25, 2009, now Pat. No. 8,930,152, which
(Continued)

(51) Int. Cl.
*G01R 31/40* (2014.01)
*G01R 35/00* (2006.01)
(Continued)

(52) U.S. Cl.
CPC .......... *G01R 21/00* (2013.01); *G01R 15/207* (2013.01); *G01R 35/00* (2013.01); *G01R 21/001* (2013.01);
(Continued)

(58) Field of Classification Search
CPC .. G01R 15/202; G01R 15/207; G01R 31/327; G01R 22/06; G01R 22/10; G01R 22/063; G01R 35/04; G01R 35/005; G01R 35/007
See application file for complete search history.

(56) References Cited

U.S. PATENT DOCUMENTS

| 3,714,516 A | 1/1973 | Howe |
| 4,012,734 A | 3/1977 | Jagoda et al. |

(Continued)

FOREIGN PATENT DOCUMENTS

| AR | 070667 | 4/2010 |
| CA | 2705528 | 5/2009 |
| CN | 1379860 | 11/2002 |
| CN | 1495432 | 5/2004 |
| CN | 1509410 | 6/2004 |
| CN | 20121017 | 3/2009 |
| CN | 101523226 | 9/2009 |
| CN | 101535819 | 9/2009 |
| CN | 101562074 | 10/2009 |

(Continued)

OTHER PUBLICATIONS

Paradiso, J.A., "Some Novel Applications for Wireless Inertial Sensors," Proc. of NSTI-Nanotech 2006, May, 2006, pp. 431-434, Boston, MA.
(Continued)

*Primary Examiner* — Minh N Tang
(74) *Attorney, Agent, or Firm* — Bryan Cave LLP

(57) ABSTRACT

A system for sensing electrical power usage in an electrical power infrastructure of a structure. The system can include a sensing device configured to be attached to a panel of the circuit breaker box overlying at least part of the one or more main electrical power supply lines. The system also can include a calibration device configured to be electrically coupled to the electrical power infrastructure of the structure. The system further can include one or more processing modules configured to receive one or more output signals from the sensing device. The sensing device can be devoid of being electrically or physically coupled to the one or more main electrical power supply lines or the electrical power infrastructure when the sensing device is attached to the panel. Other embodiments are provided.

20 Claims, 16 Drawing Sheets

Related U.S. Application Data is a continuation-in-part of application No. 14/457,032, filed on Aug. 11, 2014, now Pat. No. 9,594,098, which is a division of application No. 13/175,770, filed on Jul. 1, 2011, now Pat. No. 8,805,628, which is a continuation-in-part of application No. 12/567,561, filed on Sep. 25, 2009, now Pat. No. 8,930,152.

(60) Provisional application No. 61/380,174, filed on Sep. 3, 2010, provisional application No. 61/361,296, filed on Jul. 2, 2010.

(51) Int. Cl.
  *G01R 21/00* (2006.01)
  *G01R 15/20* (2006.01)
  *G01R 21/06* (2006.01)
  *G01R 22/06* (2006.01)

(52) U.S. Cl.
  CPC ............ *G01R 21/06* (2013.01); *G01R 22/063* (2013.01); *G01R 35/005* (2013.01)

(56) References Cited

U.S. PATENT DOCUMENTS

| | | |
|---|---|---|
| 4,612,617 A | 9/1986 | Laplace, Jr. et al. |
| 4,638,417 A | 1/1987 | Martin et al. |
| 4,706,073 A | 11/1987 | Vila Masot |
| 4,716,409 A | 12/1987 | Hart et al. |
| 4,804,957 A | 2/1989 | Selph et al. |
| 4,858,141 A | 8/1989 | Hart et al. |
| 4,891,587 A | 1/1990 | Squire |
| 5,177,560 A | 1/1993 | Stimple et al. |
| 5,229,753 A | 7/1993 | Berg et al. |
| 5,233,342 A | 8/1993 | Yashiro et al. |
| 5,268,666 A | 12/1993 | Michel et al. |
| 5,276,629 A | 1/1994 | Reynolds |
| 5,409,037 A | 4/1995 | Wheeler et al. |
| 5,428,342 A | 6/1995 | Enoki et al. |
| 5,441,070 A | 8/1995 | Thompson |
| 5,467,011 A | 11/1995 | Hunt |
| 5,483,153 A | 1/1996 | Leeb et al. |
| 5,483,838 A | 1/1996 | Holden |
| 5,495,168 A | 2/1996 | de Vries |
| 5,534,663 A | 7/1996 | Rivers et al. |
| 5,590,179 A | 12/1996 | Shincovich et al. |
| 5,600,310 A | 2/1997 | Whipple et al. |
| 5,635,895 A | 6/1997 | Murr |
| 5,650,771 A | 7/1997 | Lee |
| 5,699,276 A | 12/1997 | Roos |
| 5,717,325 A | 2/1998 | Leeb et al. |
| 5,808,846 A | 9/1998 | Holce et al. |
| 5,880,677 A | 3/1999 | Lestician |
| 5,898,387 A | 4/1999 | Davis et al. |
| 5,929,315 A | 7/1999 | Dunegan |
| 6,094,043 A | 7/2000 | Scott et al. |
| 6,137,283 A | 10/2000 | Williams et al. |
| 6,147,484 A | 11/2000 | Smith |
| 6,173,613 B1 | 1/2001 | Dunegan |
| 6,273,686 B1 | 8/2001 | Kroell et al. |
| 6,275,168 B1 | 8/2001 | Slater et al. |
| 6,310,470 B1 | 10/2001 | Hebing et al. |
| 6,320,968 B1 | 11/2001 | Linder |
| 6,330,516 B1 | 12/2001 | Kammeter |
| 6,418,083 B1 | 7/2002 | Wagstaff et al. |
| 6,420,969 B1 | 7/2002 | Campbell |
| 6,614,211 B1 | 9/2003 | Douglas |
| 6,622,097 B2 | 9/2003 | Hunter |
| 6,678,209 B1 | 1/2004 | Peng et al. |
| 6,708,126 B2 | 3/2004 | Culler et al. |
| 6,728,646 B2 | 4/2004 | Howell et al. |
| 6,734,806 B1 | 5/2004 | Cratsley |
| 6,771,078 B1 | 8/2004 | McCauley et al. |
| 6,816,078 B2 | 11/2004 | Onoda et al. |
| 6,839,644 B1 | 1/2005 | Bryant et al. |
| 6,853,291 B1 | 2/2005 | Aisa |
| 6,860,288 B2 | 3/2005 | Uhler |
| 6,906,617 B1 | 6/2005 | Van de Meulen |
| 6,910,025 B2 | 6/2005 | Cao |
| 6,949,921 B1 | 9/2005 | Feight et al. |
| 6,993,417 B2 | 1/2006 | Osann, Jr. |
| 7,019,666 B2 | 3/2006 | Tootoonian Mashhad et al. |
| 7,043,380 B2 | 5/2006 | Rodenberg et al. |
| 7,049,976 B2 | 5/2006 | Hunt et al. |
| 7,119,533 B2 | 10/2006 | Tamura et al. |
| 7,133,729 B1 | 11/2006 | Wang et al. |
| 7,134,568 B2 | 11/2006 | Moriyama et al. |
| 7,174,260 B2 | 2/2007 | Tuff et al. |
| 7,183,669 B2 | 2/2007 | Schripsema et al. |
| 7,265,531 B2 | 9/2007 | Stauth et al. |
| 7,276,915 B1 | 10/2007 | Euler et al. |
| 7,298,133 B2 | 11/2007 | Hastings et al. |
| 7,330,796 B2 | 2/2008 | Addink et al. |
| 7,400,986 B2 | 7/2008 | Latham et al. |
| 7,417,558 B2 | 8/2008 | Lightbody et al. |
| 7,460,930 B1 | 12/2008 | Howell et al. |
| 7,493,221 B2 | 2/2009 | Caggiano et al. |
| 7,498,935 B2 | 3/2009 | Kodama et al. |
| 7,508,318 B2 | 3/2009 | Casella et al. |
| 7,511,229 B2 | 3/2009 | Vlasak et al. |
| 7,541,941 B2 | 6/2009 | Bogolea et al. |
| 7,546,214 B2 | 6/2009 | Rivers, Jr. et al. |
| 7,589,942 B2 | 9/2009 | Kumfer et al. |
| 7,612,971 B2 | 11/2009 | Premerlani et al. |
| 7,656,649 B2 | 2/2010 | Loy et al. |
| 7,692,555 B2 | 4/2010 | Stanley et al. |
| 7,693,670 B2 | 4/2010 | Durling et al. |
| 7,702,421 B2 | 4/2010 | Sullivan et al. |
| 7,705,484 B2 | 4/2010 | Horst |
| 7,706,928 B1 | 4/2010 | Howell et al. |
| 7,719,257 B2 | 5/2010 | Robarge et al. |
| 7,728,986 B2 | 6/2010 | Lasker et al. |
| 7,729,993 B2 | 6/2010 | Baraty |
| 7,747,357 B2 | 6/2010 | Murdoch |
| 7,755,347 B1 | 7/2010 | Cullen et al. |
| 7,804,280 B2 | 9/2010 | Deaver, Sr. et al. |
| 7,855,655 B2 | 12/2010 | Hunter et al. |
| 7,885,917 B2 | 2/2011 | Kuhns et al. |
| 7,889,061 B2 | 2/2011 | Endo |
| 7,912,530 B2 | 3/2011 | Seki et al. |
| 7,982,596 B2 | 7/2011 | Curt et al. |
| 7,996,171 B2 | 8/2011 | Banhegyesi |
| 8,049,488 B2 | 11/2011 | Dempster et al. |
| 8,065,099 B2 | 11/2011 | Gibala et al. |
| 8,078,431 B2 | 12/2011 | Brown |
| 8,093,765 B1 | 1/2012 | Beard |
| 8,094,034 B2 | 1/2012 | Patel et al. |
| 8,140,414 B2 | 3/2012 | O'Neil et al. |
| 8,195,423 B2 | 6/2012 | Von Zon |
| 8,325,817 B2 | 12/2012 | Iwami et al. |
| 8,334,784 B2 | 12/2012 | Patel et al. |
| 8,344,724 B2 | 1/2013 | Leeb et al. |
| 8,378,845 B2 | 2/2013 | Reymann et al. |
| 8,392,107 B2 | 3/2013 | Patel et al. |
| 8,463,452 B2 | 6/2013 | Masters et al. |
| 8,494,762 B2 | 7/2013 | Patel et al. |
| 8,659,286 B2 | 2/2014 | Reynolds |
| 8,664,564 B2 | 3/2014 | Vogel |
| 8,712,732 B2 | 4/2014 | Patel et al. |
| 8,924,604 B2 | 12/2014 | Yogeeswaran et al. |
| 2001/0003286 A1 | 6/2001 | Philippbar et al. |
| 2002/0010690 A1 | 1/2002 | Howell et al. |
| 2002/0036492 A1 | 3/2002 | Slater et al. |
| 2003/0050737 A1 | 3/2003 | Osann, Jr. |
| 2003/0088374 A1 | 5/2003 | Slater et al. |
| 2003/0088527 A1 | 5/2003 | Hung et al. |
| 2003/0097348 A1 | 5/2003 | Cao |
| 2003/0112370 A1 | 6/2003 | Long et al. |
| 2003/0151406 A1 | 8/2003 | Wan et al. |
| 2003/0158677 A1 | 8/2003 | Swarztrauber et al. |
| 2003/0184280 A1 | 10/2003 | Bowman et al. |
| 2003/0193405 A1 | 10/2003 | Hunt et al. |
| 2003/0216877 A1 | 11/2003 | Culler et al. |
| 2004/0027138 A1 | 2/2004 | Pickerd et al. |

(56) References Cited

U.S. PATENT DOCUMENTS

| | | |
|---|---|---|
| 2004/0128034 A1 | 7/2004 | Lenker et al. |
| 2004/0140908 A1 | 7/2004 | Gladwin et al. |
| 2004/0196024 A1 | 10/2004 | Stauth et al. |
| 2004/0206405 A1 | 10/2004 | Smith et al. |
| 2004/0229578 A1 | 11/2004 | Lightbody et al. |
| 2004/0251897 A1 | 12/2004 | Pedersen |
| 2005/0001486 A1 | 1/2005 | Schripsema et al. |
| 2005/0060107 A1 | 3/2005 | Rodenberg, III et al. |
| 2005/0067049 A1 | 3/2005 | Fima et al. |
| 2006/0009928 A1 | 1/2006 | Addink et al. |
| 2006/0049831 A1 | 3/2006 | Anwar et al. |
| 2006/0050447 A1 | 3/2006 | Pellon et al. |
| 2006/0077046 A1 | 4/2006 | Endo |
| 2006/0103549 A1 | 5/2006 | Hunt et al. |
| 2006/0195275 A1 | 8/2006 | Latham et al. |
| 2006/0220833 A1 | 10/2006 | Berkman |
| 2006/0226958 A1 | 10/2006 | Baril et al. |
| 2006/0245467 A1 | 11/2006 | Casella et al. |
| 2006/0259201 A1 | 11/2006 | Brown |
| 2006/0259254 A1 | 11/2006 | Swarztrauber et al. |
| 2006/0284613 A1 | 12/2006 | Hastings et al. |
| 2007/0014369 A1 | 1/2007 | Santhoff et al. |
| 2007/0064377 A1 | 3/2007 | DeBoer et al. |
| 2007/0067003 A1 | 3/2007 | Sanchez et al. |
| 2007/0085534 A1 | 4/2007 | Seki et al. |
| 2007/0114987 A1 | 5/2007 | Kagan |
| 2007/0132458 A1 | 6/2007 | Allen |
| 2007/0152864 A1 | 7/2007 | Pease |
| 2007/0230094 A1 | 10/2007 | Carlson |
| 2007/0237441 A1 | 10/2007 | Roussell et al. |
| 2008/0030075 A1 | 2/2008 | Stanley et al. |
| 2008/0079437 A1 | 4/2008 | Robarge et al. |
| 2008/0082276 A1 | 4/2008 | Rivers et al. |
| 2008/0086394 A1 | 4/2008 | O'Neil et al. |
| 2008/0091345 A1 | 4/2008 | Patel et al. |
| 2008/0106241 A1 | 5/2008 | Deaver et al. |
| 2008/0167755 A1 | 7/2008 | Curt |
| 2008/0172192 A1 | 7/2008 | Banhegyesi |
| 2008/0224892 A1 | 9/2008 | Bogolea et al. |
| 2008/0234983 A1 | 9/2008 | Leigh et al. |
| 2008/0255782 A1 | 10/2008 | Bilac et al. |
| 2008/0308254 A1 | 12/2008 | Premerlani et al. |
| 2009/0043520 A1 | 2/2009 | Pollack et al. |
| 2009/0045804 A1 | 2/2009 | Durling et al. |
| 2009/0070058 A1 | 3/2009 | Lin |
| 2009/0072985 A1 | 3/2009 | Patel et al. |
| 2009/0115620 A1 | 5/2009 | Hunter et al. |
| 2009/0224754 A1 | 9/2009 | Lamarre et al. |
| 2009/0240449 A1 | 9/2009 | Gibala et al. |
| 2009/0312968 A1 | 12/2009 | Phillips |
| 2010/0030393 A1 | 2/2010 | Masters et al. |
| 2010/0049456 A1 | 2/2010 | Dempster et al. |
| 2010/0070214 A1 | 3/2010 | Hyde et al. |
| 2010/0070218 A1 | 3/2010 | Hyde et al. |
| 2010/0088057 A1 | 4/2010 | Kopaczewski et al. |
| 2010/0109842 A1 | 5/2010 | Patel et al. |
| 2010/0148579 A1 | 6/2010 | Maloney |
| 2010/0188262 A1 | 7/2010 | Reymann et al. |
| 2010/0219808 A1 | 9/2010 | Steckley et al. |
| 2010/0264731 A1 | 10/2010 | Arimilli et al. |
| 2010/0280392 A1 | 11/2010 | Liu et al. |
| 2011/0004421 A1 | 1/2011 | Rosewell et al. |
| 2011/0037444 A1 | 2/2011 | Wildash |
| 2011/0043374 A1 | 2/2011 | Bannister |
| 2011/0050218 A1 | 3/2011 | Lohss |
| 2011/0098949 A1 | 4/2011 | Vennelakanti et al. |
| 2011/0112780 A1 | 5/2011 | Moss |
| 2011/0194705 A1 | 8/2011 | Gautama |
| 2011/0218746 A1 | 9/2011 | Joo |
| 2011/0249181 A1 | 10/2011 | Iwami et al. |
| 2012/0001617 A1 | 1/2012 | Reynolds |
| 2012/0072143 A1* | 3/2012 | Yogeeswaran ....... G01R 15/207 702/61 |
| 2012/0072389 A1 | 3/2012 | Aldridge et al. |
| 2012/0092142 A1 | 4/2012 | Patel et al. |
| 2012/0215410 A1 | 8/2012 | McClure |
| 2012/0293146 A1 | 11/2012 | Zhao |
| 2013/0179124 A1 | 7/2013 | Patel et al. |

FOREIGN PATENT DOCUMENTS

| | | |
|---|---|---|
| CN | 101680676 | 3/2010 |
| DE | 102007032053 | 1/2009 |
| EP | 200312 | 11/1986 |
| EP | 1136829 | 9/2001 |
| EP | 1444527 | 4/2004 |
| EP | 2171363 | 4/2010 |
| EP | 2174395 | 4/2010 |
| EP | 2188879 | 5/2010 |
| FR | 2645968 | 10/1990 |
| FR | 2680875 | 3/1993 |
| GB | 2228337 | 8/1990 |
| GB | 2235304 | 2/1991 |
| GB | 2461915 | 1/2010 |
| GB | 2465800 | 2/2010 |
| GB | 2464634 | 4/2010 |
| GB | 2464927 | 5/2010 |
| GB | 2465367 | 5/2010 |
| JP | 2001190506 | 7/1989 |
| JP | 02212780 | 8/1990 |
| JP | 04050786 | 2/1992 |
| JP | 2004296663 | 10/1992 |
| JP | 2006062512 | 3/1994 |
| JP | 07012976 | 3/1995 |
| JP | 09130961 | 5/1997 |
| JP | 2009130961 | 5/1997 |
| JP | 10282161 | 10/1998 |
| JP | 2000258482 | 9/2000 |
| JP | 2001103622 | 4/2001 |
| JP | 2004132790 | 4/2004 |
| JP | 2004219365 | 8/2004 |
| JP | 2005195427 | 7/2005 |
| JP | 2008122083 | 8/2006 |
| JP | 2007107972 | 4/2007 |
| JP | 2010112936 | 5/2010 |
| JP | 2010282161 | 12/2010 |
| KR | 1019960024384 | 7/1996 |
| KR | 1020040087036 | 10/2004 |
| KR | 20080114143 | 12/2008 |
| KR | 20090057058 | 6/2009 |
| KR | 20090057071 | 6/2009 |
| KR | 2010021458 | 2/2010 |
| KR | 1020100032534 | 3/2010 |
| KR | 20100021604 | 8/2011 |
| RU | 2200364 | 3/2003 |
| RU | 2402023 | 10/2010 |
| WO | 9304377 | 3/1993 |
| WO | 9304377 | 4/1993 |
| WO | 0150142 | 7/2001 |
| WO | 03003029 | 1/2003 |
| WO | 2008042483 | 4/2008 |
| WO | 2008150458 | 12/2008 |
| WO | 2008153576 | 12/2008 |
| WO | 2008153577 | 12/2008 |
| WO | 20090040140 | 4/2009 |
| WO | 20090063397 | 5/2009 |
| WO | 2009081407 | 7/2009 |
| WO | 2010007369 | 1/2010 |
| WO | 2010062398 | 6/2010 |
| WO | 2011035301 | 3/2011 |
| WO | 2011057049 | 5/2011 |
| WO | 2011104661 | 9/2011 |
| WO | 2012003426 | 1/2012 |

OTHER PUBLICATIONS

Rowan, J., and Mynatt, E.D., "Digital Family Portrait Field Trial: Support for Aging in Place," Proc. of ACM Conference (CHI 2005), Apr. 2005, pp. 521-530.

Tapia, E., et al., "Activity Recognition in the Home Setting Using Simple and Ubiquitous Sensors," Pervasive Computing (Lecture Notes in Computer Science), 2004, pp. 158-175.

(56) References Cited

OTHER PUBLICATIONS

Weka 3—Data Mining with Open Source Machine Learning Software in Java, "Weka 3: Data Mining Software in Java," http://www.cs.waikato.ac.nz/ml/weka/, Mar. 2006, 1 page.
Wilson, D., and Atkeson, C., "Simultaneous Tracking and Activity Recognition (STAR) Using Many Anonymous, Binary Sensors," In the Proceedings of Pervasive 2005, pp. 62-79.
Calwell, C. and Reeder, T., "Power Supplies: A Hidden Opportunity for Energy Savings," NRDC, May 22, 2002, 28 pages.
Rosenblat, L., "The Basic Power Supply Tutorial: Design Concepts, Block Diagram, Theory of Operation," http://www.smps.us/power-supply.html, Jun. 8, 2010, 3 pages.
Product Data Sheet for UBA2021 630 V driver IC for CFL and TL lamps, NXP Semiconductors, Jul. 25, 2008, 16 pages.
P3 International, "Kill a Watt™, Electricity Usage Monitor", Innovative Electronic Solutions, http://www.p3international.com/products/special/P4400/P4400-CE.html, 2008, 1 page.
Compliance Certification Services (Shenzhen) Inc., "FCC Class B Compliance Report," prepared for Jet Way Information Co., Ltd., Dec. 29, 2006, 20 pages.
Kim, Y., Schmid, T., Charbiwala, Z.M., and Srivastava, M.B., "ViridiScope: Design and Implementation of a Fine Grained Power Monitoring System for Homes," In the Proceedings of UbiComp, Sep. 30, 2009, 10 pages.
Lifton, J., Feldmeier, M., Ono, Y., Lewis, C., and Paradiso, J.A., "A Platform for Ubiquitous Sensor Deployment in Occupational and Domestic Environments," In the Proceedings of the 6th International Conference on Information Processing in Sensor Networks, 2007.
Rubner, J., "Tech Professor Developing Camera Cloak," Atlanta Business Chronicle, Jun. 15, 2007, 2 pages.
Murph, D., "Electrical Noise Could Help Automate Your Home," Engadget, Sep. 12, 2007, 4 pages.
Kleiner, K., "'Smart Homes' Could Track Your Electrical Noise," New Scientist, Sep. 10, 2007, 2 pages.
"Study Finds Elder Care a Growing Emotional and Financial Burden for Baby Boomers," New ADT monitoring service for elderly helps ease the stress of long distance care giving, PR Newswire Europe, Mar. 29, 2005, 4 pages.
HomePlug Powerline Alliance, web.archive.org/web/20060225110208/www.homeplug.org/en/products/index.asp, 2006, 1 page.
Abowd, G., and Mynatt, E.D., "Charting Past, Present, and Future Research in Ubiquitous Computing," ACM Transactions on Computer-Human Interaction, Mar. 2000, pp. 29-58, vol. 7, No. 1.
Edwards, W.K., and Grinter, R.E, "At Home with Ubiquitous Computing: Seven Challenges," In the Proceedings of UbiComp 2001, Sep. 30-Oct. 2, 2001, 17 pages.
Crabtree, A., and Rodden, T., "Domestic Routines and Design for the Home," Computer Supported Cooperative Work: The Journal of Collaborative Computing, Kluwer Academic Publishers, 2004, 40 pages, vol. 12 (2).
Hemmings, T., Crabtree, A., Rodden, T., Clarke, K., and Rouncefield, M., "Probing the Probes," Proceedings of the 7th Biennial Participatory Design Conference, Jun. 23-25, 2002, pp. 42-50, Malmö, Sweden.
Intille, S.S., Tapia, E.M., Rondoni, J., Beaudin, J., Kukla, C., Agarwal, S., Bao, L., and Larson, K., "Tools for Studying Behavior and Technology in Natural Settings," In the Proceedings of UbiComp 2003.
Aipperspach, R., Rattenbury, T., Woodruff, A., and Canny, J., "A Quantitative Method for Revealing and Comparing Places in the Home," In the Proceedings of UbiComp 2006, Sep. 2006, pp. 1-18, Orange County, CA.
Aipperspach, R., Woodruff, A, Anderson, K., and Hooker, B., "Maps of Our Lives: Sensing People and Objects Together in the Home," EECS Department, University of California, Berkeley, Nov. 30, 2005, pp. 1-11.
Elliot, K., Neustaedter, C., and Greenberg, S., "Time, Ownership and Awareness: The Value of Contextual Locations in the Home," In the Proceedings of UbiComp (Proceedings of the 7th International Conference on Ubiquitous Computing, Tokyo, Japan), 2005.
O'Brien, J., Rodden, T., Rouncefield, M., and Hughes, J., "At Home with the Technology: An Ethnographic Study of a Set-Top-Box Trial," ACM Transactions on Computer-Human Interaction, Sep. 1999, pp. 282-308, vol. 6, No. 3.
Mainwaring, S.D., and Woodruff, A., "Investigating Mobility, Technology, and Space in Homes, Starting with Great Rooms," In the Proceedings of EPIC 2005, Nov. 14-15, 2005, pp. 188-195.
Philipose, M., Fishkin, K.P., Perkowtiz, M., Patterson, D.J., Fox, D., Kautz, H., and Hähnel, D., "Inferring Activities from Interactions with Objects," IEEE Pervasive Computing, Oct.-Dec., 2004, pp. 10-17, vol. 3, Issue 4.
Bin, S. and Dowlatabadi, H. Consumer lifestyle approach to US energy use and the related $CO_2$ emissions. Energy Policy 33, 2 (2005), 197-208.
Froehlich, et. al., "Hydro-Sense: Infrastructure-Mediated Single-Point Sensing of Whole-Home Water Activity," In Proc. of UbiComp 2009, Sep.-Oct. 2009, pp. 235-244, Florida.
Mitchell, T., "Machine Learning," McGraw Hill, 1997.
International Search Report and Written Opinion for corresponding Int'l Application No. PCT/US11/033992 dated Dec. 26, 2011.
Crabtree, A., Rodden, T., Hemmings, T., and Benford, S., "Finding a Place for UbiComp in the Home," In the Proceedings of UbiComp 2003, Oct. 12-15, 2003, pp. 208-226, Seattle, Washington.
Anant Sahai, Cyclostationary Feature Detection, 2005, DySPAN, pp. 1-69.
Int'l Search Report and Written Opinion for corresponding Int'l, Application No. PCT/US12/57224 dated Mar. 8, 2013.
Michael K. Williams (A Discussion of Methods for Measuring Low-Amplitude Jitter, 1995).
Steven C. Venema in A Kalman Filter Calibration Method for Analog Quadrature Position Encoders, Copyright 1994, 99 pages.
Fault Tolerant Control and Fault Detection and Isolation, DOI 10.1007/978-0-85729-650-4_2, Springer-Verlag London Limited 2011, pp. 7-27.
International Search Report and Written Opinion from corresponding Int'l, Application No. PCT/US2011/042877, dated Jul. 1, 2011, Nine (9) pages.
Bian, X., Abowd, G.D., and Rehg, J.M., "Using Sound Source Localization to Monitor and Infer Activities in the Home," In the Proceedings of the Third International Conference on Pervasive Computing, May 8-13, 2005.
Burges, C., "A Tutorial on Support Vector Machines for Pattern Recognition," Journal of Data Mining and Knowledge Discovery, Jun. 1998, pp. 121-167, vol. 2, Kluwer Academic Publishers, Hingham, MA.
Howell, E.K., "How Switches Produce Electrical Noise," IEEE Transactions on Electromagnetic Compatibility, Aug. 1979, pp. 162-170, vol. EMC-21, No. 3.
Koile, K., Tollmar, K., Demirdjian, D., Shrobe, H., and Darrell, T., "Activity Zones for Context-Aware Computing," Proceedings of UbiComp 2003, Oct. 12-15, 2003, pp. 90-106.
Marubayashi, G., "Noise Measurements of the Residential Power Line," Proc. of Int'l. Symposium on Power Line Communications, 1997, pp. 104-108.
Gupta, S., Reynolds, M.S., and Patel, S.N. ElectriSense: Single-Point Sensing Using EMI for Electrical Event Detection and Classification in the Home. In Proc. of UbiComp 2010.
Chen, J., Kam, A.H., Zhang, J., Liu, N., and Shue, L. Bathroom Activity Monitoring Based on Sound. (2005). In Pervasieve 2009, 47-61.
Cooley, J.J., Member, S., and Vickery, D. A Retrofit 60 Hz Current Sensor for Power Monitoring at the Circuit Breaker Panel, 2010.
Froehlich, J., Findlater, L., and Landay, J. The design of eco-feedback technology. In CHI 2010, 1999-2008.
Hart, G. Advances in nonintrusive appliance load monitoring. Proceedings of EPRI Information and Automation Coference, (1991).
Ho, B., Kao, H.C., Chen, N., et al. HeatProbe: A Thermal-based Power Meter for Accounting Disaggregated Electricity Usage. In UbiComp 2011.

(56) References Cited

OTHER PUBLICATIONS

Kawahara, Y., Hodges, S., Cook, B.S., and Abowd, G.D. Instant Inkjet Circuits: Lab-based Inkjet Printing to Support Rapid Prototyping of UbiComp Devices. In UbiComp 2013, 363-372.
Lorek, M.C., Chraim, F., Pister, K.S.J., and Lanzisera, S. COTS-based stick-on electricity meters for building submetering. 2013 Ieee Sensors, (2013), 1-4.
Patel, S.N., Gupta, S., and Reynolds, M.S. The design and evaluation of an end-user-deployable, whole house, contactless power consumption sensor. In CHI 2010.
Arvola et al., "Billing Feedback as a Means to Encourage Household Electricity Conservation: A Field Experiment in Helsinki." Proceedings of the 1993 Summer Study of the European Council for Energy Efficient Economy: 11-21, 2003.
Beckmann et al., "Some Assembly Required: Supporting End-User Sensor Installation in Domestic Ubiquitous Computing Environments." UbiComp 2004: 107-124, 2004.
Brandon et al., "Reducing Household Energy Consumption: A Qualitative and Quantitative Field Study." Journal of Enviornmental Psychology: 75-85, 1999.
Chetty et al., "Getting to Green: Understanding Resource Consumption in the Home." UbiComp 2008: 242-251, 2008.
Clifford et al., "A Retrofit 60 Hz Current Sensor for Non-Intrusive Power Monitoring at the Circuit Breaker." 8 pp., 2010.
Darby, Sarah., "Making it Obvious: Designing Feedback into Energy Consumption." Proceedings of the Second International Conference on Energy Efficiency in Household Appliances and Lighting: 11 pp., 2000.
Darby, Sarah., "The Effectiveness of Feedback on Energy Consumption: A Review for DEFRA on the Literature on Metering, Billing and Direct Displays." Environmental Change Institute: 21 pp., 2006.
Drenker et al., "Nonintrusive monitoring of electronic loads." IEEE pp. 47-51, Oct. 1999.
Fischer, Corinna., "Feedback on Household Electricity Consumption: A Tool for Saving Energy?" Energy Efficiency: 79-104, 2008.
Fitzpatrick et al., "Technology-Enabled Feedback on Domestic Energy Consumption: Articulating a Set of Design Concerns." PERVASIVEcomputing: 37-44, 2009.
Froehlich et al., "Sensing Opportunities for Personalized Feedback Technology to Reduce Consumption." UW CSE Technical Report: CSE 09-13-01: 7 pp., 2009.
Froehlich, Jon., "Sensing and Feedback of Everyday Activities to Promote Environmentally Sustainable Behaviors." Thesis Proposal, Computer Science and Engineering, University of Washington: 35 pp., 2009.
Hart, George W., Nonintrusive Appliance Load Monitoring. Proceedings of the IEEE, vol. 80, No. 12, Dec. 1992, pp. 1870-1891.
Hirsch et al., "The ELDer Project: Social, Emotional, and Environmental Factors in the Design of Eldercare Technologies." Conference on Universal Usability 2000: 72-79, 2000.
Horst, Gale., "Whirlpool Corporation: Woodridge Energy Study and Monitoring Pilot." 1-99, 2006.
Iachello et al., "Privacy and Proportionality: Adapting Legal Evaluation Techniques to Inform Design in Ubiquitous Computing." CHI 2005: 91-100, 2005.
Laughman et al., "Power Signature Analysis." IEEE Power and Engineering Magazine: 56-63, 2003.
Murata et al., "Estimation of Power Consumption for Household Electric Appliances." Proceedings of the 9th International Conference on Neural Information Processing: 2209-2303, 2002.
N.a., "End-User-Deployable Whole House Contact-Less Power Consumption Sensing." UbiComp 2009: 4 pp., 2009.
N.a., "Summary: The Impact of Real-Time Feedback on Residential Electricity Consumption: The Hydro One Pilot." 4 pp., 2006.
Parker et al., "Contract Report: Pilot Evaluation of Energy Savings from Residential Energy Demand Feedback Devices." Florida Solar Energy Center, A Research Institute of the University of Central Florida: 32 pp., 2008.
Patel et al., "At the Flick of a Switch: Detecting and Classifying Unique Electrical Events on the Residential Power Line." UbiComp 2007: 271-288, 2007.
Patel et al., "Detecting Human Movement by Differential Air Pressure Sensing in HVAC System Ductwork: An Exploration in Infrastructure Mediated Sensing." Pervasive: 1-18, 2008.
Patel et al., "PowerLine Positioning: A Practical Sub-Room-Level Indoor Location System for Domestic Use." UbiComp 2006: 441-458, 2006.
Patel, Shwetak., "Bringing Sensing to the Masses: An Exploration in Infrastructure-Mediated Sensing." Intel Labs: 133 pp., 2008.
Ramirez-Munoz et al., "Design and experimental verification of a smart sensor to measure the energy and power consumption in a one-phase AC line." Measurement vol. 42: 412-419, Aug. 2008.
Stuntebeck et al., "Wideband PowerLine Positioning for Indoor Localization." UbiComp 2008: 94-103, 2008.
Tapia et al., "The Design of a Portable Kit of Wireless Sensors for Naturalistic Data Collection." Pervasive 2006 K.P. Fishkin et al. (Eds.): 117-134, 2006.
Ueno et al., "Effectiveness of Displaying Energy Consumption Data in Residential Houses—Analysis on how the Residents Respond." ECEEE 2005 Summer Study—What Works and Who Delivers?: 1289-1299, 2005.
Definition of "correlation", thefreedictionary.com, http://www.thefreedictionary.com/p/correlation, last accessed (Oct. 30, 2012).
Kientz et al., "The Georgia Tech Aware Home." CHI 2008: 3675-3680, 2008.
Mountain, Dean., "Price Influences Demand." DeGroote School of Business, McMaster University: 16 pp., 2008.
Wood et al., "Energy-use Information Transfer for Intelligent Homes: Enabling Energy Conservation with Central and Local Displays." Energy and Buildings, vol. 39: 495-503, 2007.
International Search Report and Written Opinion from corresponding Int'l Application No. PCT/US2011/042877, dated Dec. 27, 2011, ten (10) pages.
International Search Report and Written Opinion from corresponding Int'l Application No. PCT/US2011/042873, dated Dec. 26, 2011, ten (10) pages.
International Search Report and Written Opinion from corresponding Int'l Application No. PCT/US2010/043410, dated Feb. 28, 2011, ten (10) pages.
Warner, Hall-Effect Sensors Measure Up, ECN Magazine, http://www.ecnmag.com/print/articles/2009/03/sensor-zone-april-2009, Apr. 2009.
Formisano, Bob, How to Safely Turn Off Power at the Electrical Panel, http://homerepair.about.com/od/electricalrepair/ss/turn_off_main_elect_2.htm?p=1, (Picture from 2009), (last accessed Jun. 13, 2013).
N.A., "The Value of Disaggregated Feedback," 1 pg., 2009.
Prudenzi, A., "A Neuron Nets Based Procedure for Identifying Domestic Appliances Pattern-of-Use from Energy Recordings at Meter Panel," IEEE pp. 941-946, Aug. 7, 2002.
Fogarty, J., Au, C., and Hudson, S., "Sensing from the Basement: A Feasibility Study of Unobtrusive and Low-Cost Home Activity Recognition," In the Proceedings of ACM Symposium on User Interface Software and Technology, UIST'06, Oct. 15-18, 2006, Montreux, Switzerland.
Yunhoon Cho et al., "Design and Implementation of Practical Step Detection Algorithm for Wrist-Worn Devices," IEEE Sensors Journal, vol. 16, No. 21, Nov. 1, 2016, pp. 7720-7730.
Bin Fang et al., "Development of a Wearable Device for Motion Capturing Based on Magnetic and Inertial Measurement Units," Hindawi: Scientific Programming, vol. 2017, Article ID 7594763, Jan. 18, 2017, 11 pages.

* cited by examiner

SELF-CALIBRATING CONTACTLESS POWER CONSUMPTION SENSING

CROSS-REFERENCE TO RELATED APPLICATIONS

This application is a continuation-in-part of U.S. patent application Ser. No. 12/567,561, filed Sep. 25, 2009, now U.S. Pat. No. 8,930,152, and a continuation-in-part of U.S. patent application Ser. No. 14/457,032, filed Aug. 11, 2014, now U.S. Pat. No. 9,594,098, which is a divisional application of U.S. patent application Ser. No. 13/175,770, filed Jul. 1, 2011, now U.S. Pat. No. 8,805,628, which is a continuation-in-part of U.S. patent application Ser. No. 12/567,561, filed Sep. 25, 2009, now U.S. Pat. No. 8,930,152, and claims the benefit of U.S. Provisional Application No. 61/380,174, filed Sep. 3, 2010, and U.S. Provisional Application No. 61/361,296, filed Jul. 2, 2010. U.S. patent application Ser. Nos. 12/567,561, 13/175,770, and 14/457,032, and U.S. Provisional Application Nos. 61/380,174 and 61/361,296 are incorporated herein by reference in their entirety.

TECHNICAL FIELD

This disclosure relates generally to sensing electric power consumption, and relates more particularly to self-calibrating, contactless power consumption sensing.

BACKGROUND

Energy conservation and eco-feedback research continues to be a focus in the Ubiquitous Computing (Ubicomp) and Human-Computer Interaction (HCI) communities. Given that 28% of U.S. energy consumption is directly contributed by household activities, the home is a natural place to study. Yet obtaining whole-home power consumption information in real-time by homeowners or even researchers can be a challenging task. For instance, certain smart meters provide data at 15 minutes intervals, yet gaining access to that information can be difficult due to closed-source and often private protocols and application interfaces. One common approach is to install commercially available current transformers (CTs) inside the breaker panel. Safely installing CTs, however, requires hiring a trained electrician as it involves placing a sensor around the main electrical feed in the breaker panel. Most researchers and homeowners do not have the training or confidence to do such an installation. In fact, the National Electric Code (NEC) has strict rules on the requirement of professional installation of CTs. In addition, certain states in the United States altogether prohibit CTs from being installed inside the breaker panel, in which case an alternative is to use an expensive pass-through meter. The pass-through meter requires involvement of the utility company, as an end-user cannot tamper with or alter the installation of an electricity meter.

BRIEF DESCRIPTION OF THE DRAWINGS

To facilitate further description of the embodiments, the following drawings are provided in which.

Figure 1:
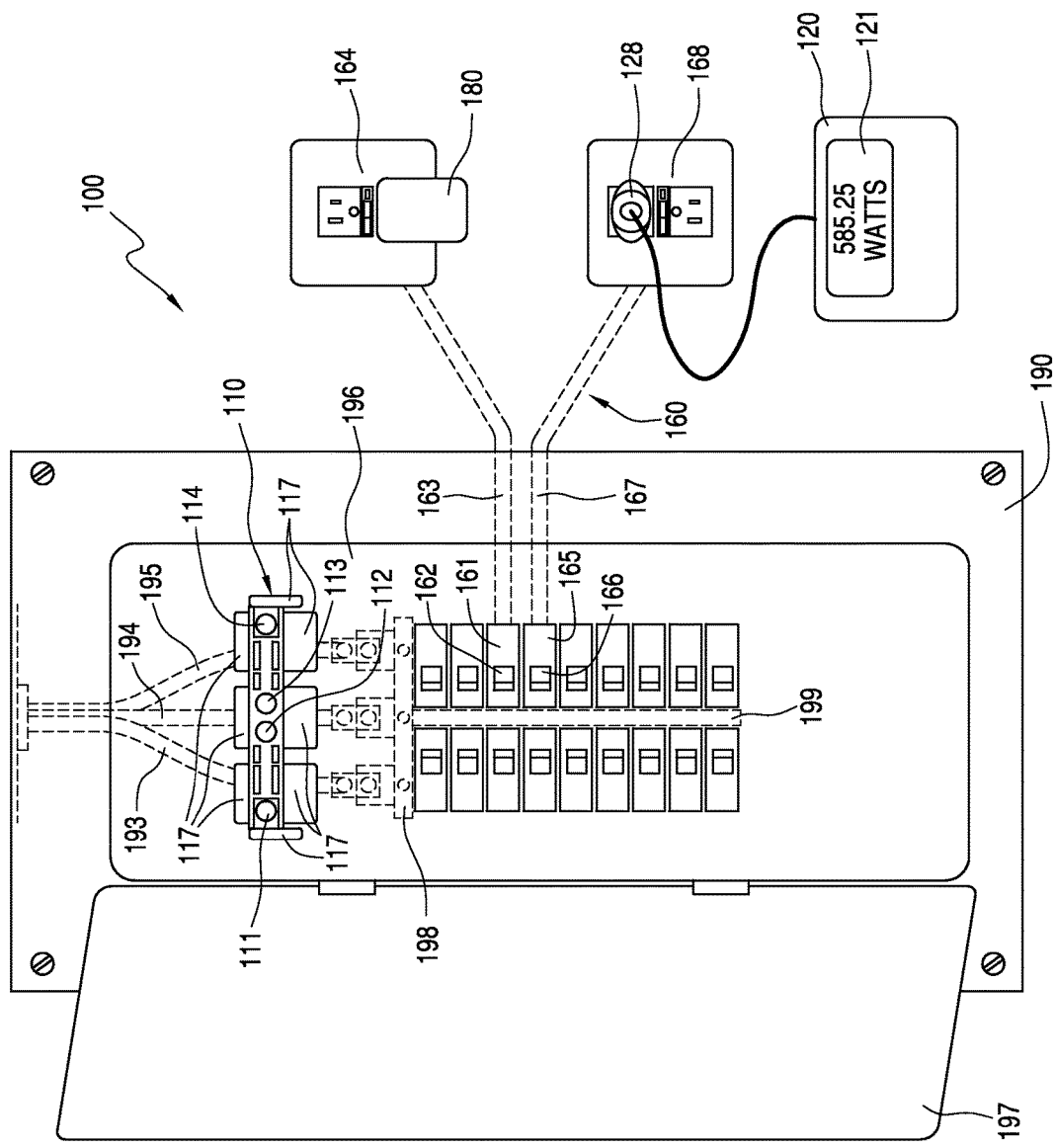
FIG. 1 illustrates a view of an exemplary system attached to a circuit breaker and electrical power infrastructure of a structure, according to a first embodiment.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The terms "couple," "coupled," "couples," "coupling," and the like should be broadly understood and refer to connecting two or more elements mechanically and/or otherwise. Two or more electrical elements may be electrically coupled together, but not be mechanically or otherwise coupled together. Coupling may be for any length of time, e.g., permanent or semi-permanent or only for an instant. "Electrical coupling" and the like should be broadly understood and include electrical coupling of all types. The absence of the word "removably," "removable," and the like near the word "coupled," and the like does not mean that the coupling, etc. in question is or is not removable. "Mechanical coupling" and the like should be broadly understood and include mechanical coupling of all types.

The absence of the word "removably," "removable," and the like near the word "coupled," and the like does not mean that the coupling, etc. in question is or is not removable.

As defined herein, two or more elements are "integral" if they are comprised of the same piece of material. As defined herein, two or more elements are "non-integral" if each is comprised of a different piece of material.

As defined herein, "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

DESCRIPTION OF EXAMPLES OF EMBODIMENTS

Various embodiments include a system for sensing electrical power usage in an electrical power infrastructure of a structure. The structure can include a circuit breaker box and one or more main electrical power supply lines for the electrical power infrastructure of the structure. The system can include a sensing device configured to be attached to a panel of the circuit breaker box overlying at least part of the one or more main electrical power supply lines. The sensing device can include one or more magnetic field sensors. The system also can include a calibration device configured to be electrically coupled to the electrical power infrastructure of the structure. The calibration device can include a load unit. The system further can include one or more processing modules configured to receive one or more output signals from the sensing device. The sensing device can be devoid of being electrically or physically coupled to the one or more main electrical power supply lines or the electrical power infrastructure when the sensing device is attached to the panel. The one or more processing modules can be further configured to determine the electrical power usage when the sensing device is coupled at any location over the panel, based at least in part on the one or more output signals received from the sensing device.

Several embodiments include a method of sensing electrical power being provided to a structure using a sensing device, a calibration device, and one or more processing modules. The sensing device can include one or more magnetic field sensors. The sensing device can be attached to a panel of a circuit breaker box. The panel of the circuit breaker box can overlie at least a part of one or more main electrical power supply lines for an electrical power infrastructure of a structure. The calibration device can include a load unit. The calibration device can be electrically coupled to the electrical power infrastructure of the structure. The method can include automatically calibrating the sensing device by determining a first transfer function in a piecewise manner based on a plurality of ordinary power consumption changes in the structure over a first time period. The method also can include determining a power consumption measurement using the one or more processing modules based on one or more output signals of the sensing device and the first transfer function.

Several embodiments can include a method of sensing electrical power being provided to a structure using a sensing device, a calibration device, and one or more processing modules. The sensing device can be attached to a panel of a circuit breaker box. The panel of the circuit breaker box can overlie at least a part of one or more main electrical power supply lines for an electrical power infrastructure of a structure. The calibration device can include a load unit. The method can include determining a current flowing in the one or more main electrical power supply lines based at least in part on one or more output signals of the sensing device. The method also can include determining a phase difference between the current flowing in the one or more main electrical power supply lines and a voltage measured by the calibration device. The calibration devices can be electrically coupled to the electrical power infrastructure of the structure. The sensing device can include one or more magnetic field sensors configured to measure a magnetic flux produced by at least a part of the one or more main electrical power supply lines and generate the one or more output signals of the sensing device based on the magnetic flux measured by the sensing device. The sensing device can be devoid of being electrically or physically coupled to the one or more main electrical power supply lines.

Contactless power consumption sensors have been used to reduce such deployment burdens by offering "stick on" sensors that go on the outside of the breaker panel. That technique has utilized magnetic sensors to sense the magnetic field induced by the 60 Hertz (Hz) current flowing through the main lines inside the breaker panel. That existing approach was a step towards simple and easy to deploy non-intrusive power monitoring, but there can be some limitations to consider. First, the existing approach can require the user to precisely position the sensor on the panel, which is a difficult task for an end-user to perform. Second, the existing approach can assume a linear transfer function between the magnetic sensors and the current, which limits its accuracy to a small current range. Third, the existing approach does not necessarily take into account the small fields generated by the various branch circuits that may reside in the area directly behind the magnetic sensors. Fourth, the existing approach can infer apparent power, but not necessarily true (real) power, because it does not take into account the phase information between the voltage and current waveforms. By not being able to determine true power, the existing approaches might not able to accurately infer power use of highly inductive loads, such as compact fluorescent lamps (CFL), light emitting diodes (LEDs), heating, ventilation, and air conditioning (HVAC) systems, computers, televisions (TVs), etc., which now tend to constitute much of the power consumption in a modern home. In addition, researchers in the energy disaggregation community have limited utility with just the apparent power data.

Prior technologies have utilized a plug-in calibrator, but with the assumption that the plug-in calibrator would draw known power loads to fit a transfer function. One possible drawback of such an approach, however, is that it can assume the calibrator is able to draw a large range of loads, such as between 0 and 20 kilowatts (kW), depending on the size of the home and types of appliances present. It can be impractical for a plug-in calibrator to draw such large loads because of safe heat-dissipation limitations, as well as the difficulty of constructing such a device in a small form factor.

There are many commercially available sensors for measuring and showing appliance level energy use at each outlet, such as the Conserve Insight™, GreenSwitch, and Kill-A-Watt™ products. In the case of whole-house power consumption measurement, some of the popular commercially available solutions are The Energy Detective (TED®) and the PowerCost Monitor products. Installing TED products involves placing a CT around the main electrical feeds (mains) inside the breaker panel, which requires a professional installation due to high-voltage shock hazard. On the other hand, PowerCost products can be easily installed by a homeowner without hiring an electrician, but can require either electromechanical meters or electronic meters with an exposed and compatible optical port. Hence, it can be constrained to specific types of meters with its update rate, as well as performance dependent on the meter and its exposed data ports.

Because of such limitations, contactless solutions are emerging that try to infer power without having direct access to the mains. One such approach measures the current at individual circuit breakers using a magnetic sensor placed on the face of the breaker switch itself. But most electric codes do not allow anything to be placed on the circuit breakers for extended use because of the potential interference with its life-saving cutoff operation. In addition, such an approach would require a sensor to be placed on each circuit breaker to gather whole home power use or on the main circuit breaker, if present. In a similar magnetic field-based approach, a magnetic sensor is required to be placed on every breaker switch on the panel. In addition to requiring several sensors, such an approach also needs to be calibrated manually by the homeowner, which can be extremely difficult and/or impractical for a homeowner to perform.

Another approach uses a pair of magnetic sensors placed on the face of the breaker panel (instead of the breakers) to sense the current flowing through the main bus bars. That approach utilized a set of LEDs to help guide the user in the placement of the sensors. That approach also used a load calibrator to create a transfer function, but assumed a linear transfer function and that the calibrator could emulate the entire power range of the house. Despite the use of LEDs to help with placement, other branch circuits and stray wires can impact the magnetic field under the sensors. Moreover, the state of the magnetic flux changes throughout the day as various appliances are used, which means that the LEDs are most helpful when the breaker panel state remains the same after the initial installation and are least helpful when the breaker panel state changes significantly after the initial installation. Further, that approach inferred apparent power, but did not take into account the phase angle between current and reference voltage.

Figure 2:
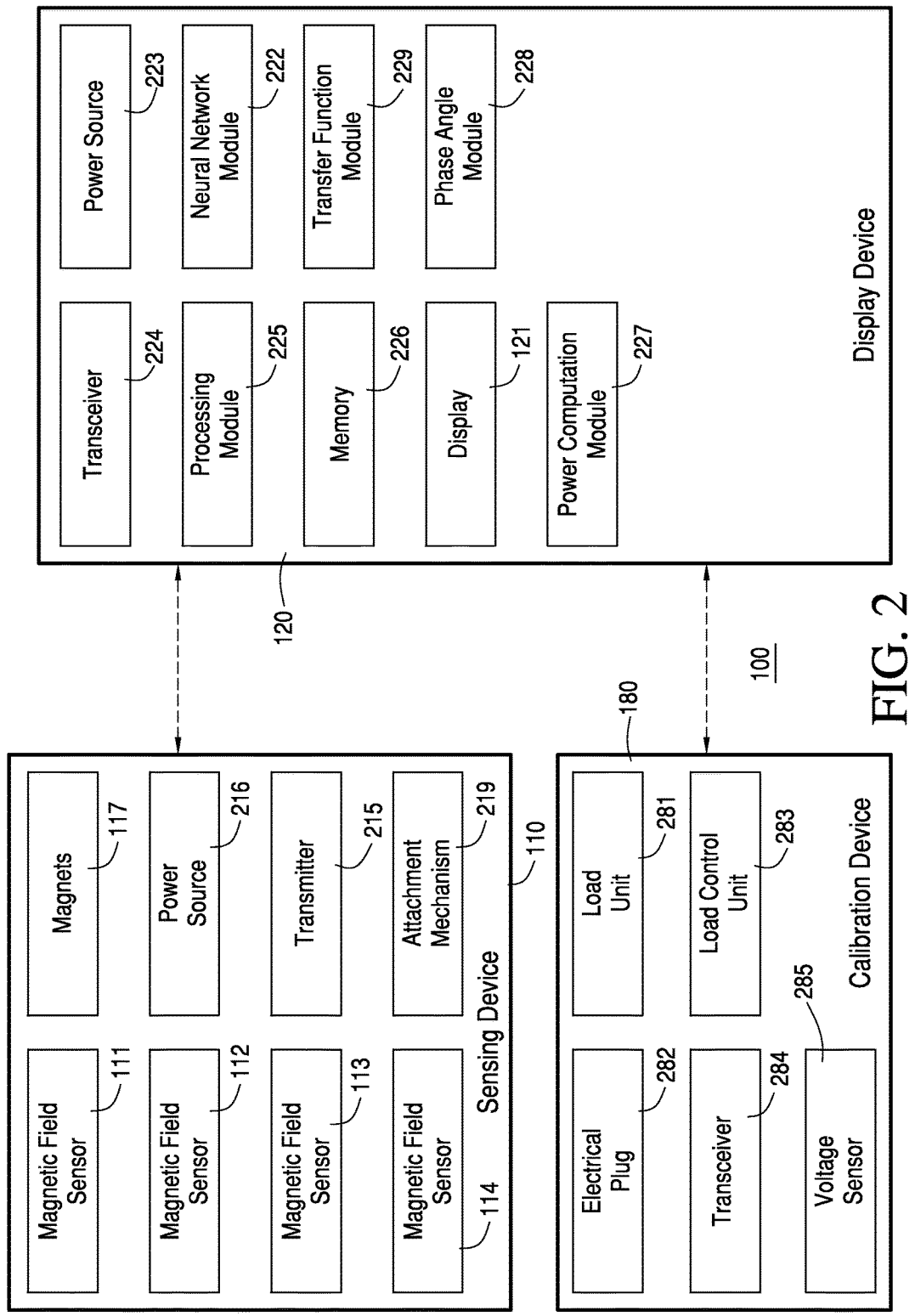
FIG. 2 illustrates a block diagram of the system of FIG. 1.

Turning to the drawings, FIG. 1 illustrates a view of an exemplary system 100 attached to a circuit breaker 190 and electrical power infrastructure 160 of a structure, according to a first embodiment. FIG. 2 illustrates a block diagram of system 100, according to the first embodiment. System 100 is merely exemplary and is not limited to the embodiments presented herein. System 100 can be employed in many different embodiments or examples not specifically depicted or described herein. System 100 can be considered a system for sensing electrical power usage in electrical power infrastructure 160 of the structure. For example, the structure can be any building that is provided with a distinct electrical service and/or serves a designated purpose. Examples of structures include single family residences, apartments, condominiums, townhouses, duplexes, triplexes, quadraplexes, and so forth, as well as commercial structures such as businesses, warehouses, and factories—to list but a few by way of example, but without any intended or implied limitation.

In some embodiments, system 100 can include: a sensing device 110, a display device 120, and/or a calibration device 180. In many examples, system 100 can be used on a conventional breaker box or circuit breaker panel, such as circuit breaker panel 190. Circuit breakers panels in the United States generally comply with the General Electric "style" based on the guidelines from National Electrical Manufacturers Association (NEMA). Specifically, circuit breaker panels generally have a front surface with an access door. The front surface generally covers the interior where main electrical feeds or lines are connected to a bus bar. As shown in FIG. 1, circuit breaker panel 190 can include individual circuit breakers, such as individual circuit breaker 165 and individual circuit breaker 161. In various embodiments, circuit breaker panel 190 can include panel 196 with an exterior surface. In several embodiments, circuit breaker panel 190 can include a door 197 that provides access to panel the individual circuit breakers (e.g., 161, 165) and/or panel 196. In a number of embodiments, circuit breaker panel 190 can include one or more main circuit breakers (not shown). In many embodiments, circuit breaker panel 190 can include at least a portion of main electrical power conductors 193, 194, and 195.

In various embodiments, the individual circuit breaker (e.g., 161, 165) can include circuit breaker levers (e.g., circuit breaker levers 162 and 166, respectively), and can provide electrical power through branch circuits, such as branch circuits 163 and 167, respectively. For example, branch circuit 163 can provide electrical power to receptacle 164 of the structure, and/or branch circuit 167 can provide electrical power to receptacle 168 of the structure. In several embodiments, electrical power infrastructure 160 of the structure can include at least circuit breaker panel 190, main electrical power conductors 193, 194, and 195 ("feeds"/ "legs"), and the branch circuits in the structure, such as branch circuits 163 and 167. In many examples, main electrical power conductors 193, 194, and 195 can be electrically coupled to attachment bar 198, and/or connected to one or more bus bars, such as bus bar 199, which can supply electrical power to the individual circuit breakers (e.g., 161, 165) and to the branch circuits (e.g., 163, 167) in electrical power infrastructure 160. In many embodiments, panel 196 can overlie at least part of main electrical power conductors 193, 194, and 195 and associated circuitry to protect people from inadvertently contacting these energized electrical power conductors. Panel 196 can be composed of steel or another metal. In many examples, door 197 covers the individual circuit breakers (e.g., 161, 165), and is typically closed for aesthetic reasons but can be opened to allow access to the levers (e.g., 162, 166) of the individual circuit breakers (e.g., 161, 165) within circuit breaker panel 190.

In many embodiments, system 100 can be used to compute the current consumption in the structure by inferring the current being drawn through the main electrical power conductors 193, 194, and 195. In general, residential and small commercial electrical service is typically 240 volt (V) split phase service. This refers to the utility providing two 120 V alternating current (AC) source conductors (e.g., power conductors 193 and 195) that are 180 degrees out of phase, along with a neutral conductor (e.g., power conductor 194) that can be used to return current from either power conductor 193 or 194. Power conductors 193, 194, and 195 can be the "feeder" or "main" electrical power conductors that carry the incoming power from the utility before being split up into branch circuits (e.g., 163, 167) that serve different loads within the structure. The 120 V loads can primarily include lower-wattage loads, i.e., loads plugged into standard 3-prong 120 V 15 ampere (A) or 120 V 20 A outlets, and small appliances with less than approximately 2 kilowatt (kW) power draw. These loads can be wired in individual circuits and attached to receptacles, such as receptacles 164 and 168, and can flow between main electrical power conductors 193 and 194 pair (the "first phase branch" or "first leg"), or between main electrical power conductors 195 and 194 pair (the "second phase branch" or "second leg.") The 240 V loads are typically large appliances (e.g., electric dryer, stove, air conditioner compressor, electric baseboard heaters) that consume more than two kW (kilowatts). In this case, the load current flows between power conductors 193 and 195 and no load current flows in power conductor 194. Because of the 180 degree phase relationship between the voltages on power conductors 193 and 195, the total voltage is 240 V.

Industrial buildings typically have three-phase service where the three phases are 120 degrees offset from each other. Although a single phase power service has been described above, system 100 can also be used with a three phase power service as well. In either case, system 100 can predict the current flowing through all the legs (e.g., main electrical power conductors 193, 194, 195). By sensing the magnetic fields generated by main electrical power conductors 193, 194, and 195, system 100 can sense the total current drawn by all loads from the utility because all loads in the structure are coupled in parallel to power conductors 193, 194, and/or 195. The field generated from the main legs (e.g., 193, 194, 195) can be used to estimate the current flowing through each leg (e.g., 193, 194, 195) separately, which radiates a few centimeters from the wire (e.g., 193, 194, 195) and even through the layer of sheet metal of panel 196. In the ideal situation, magnetic field would scale linearly with the current. The relationship between magnetic field and current, however, is not as simple in practice because of fields from all neighboring wires, reflected magnetic fields, and magnetic nonlinearities of the sheet metal.

Still referring to FIGS. 1-2, in many embodiments sensing device 110 can include one or more magnetic field sensors, such as magnetic field sensors 111, 112, 113, and 114. Magnetic field sensors 111-114 can include an inductive pickup, a Hall effect sensor, a magnetoresistive sensor, or any other type of sensor configured to respond to the time varying magnetic field produced by the conductors inside circuit breaker panel 190. For example, magnetic field sensors 111-114 can be a RadioShack removable telephone pickup sensors, model number 07C12. Magnetic field sensors 111-114 can be placed on the exterior surface of panel 196 to detect the magnetic field radiated from the 60 Hz current flowing in main electrical power conductors 193, 194, and 195 behind panel 196, as well as some of the branch circuits (e.g., 163, 167). FIG. 1 shows a sample placement of sensing device 110 on panel 196. In some embodiments, the magnetic field sensors (e.g., 111-114) can be printed as an array of inductors using ubiquitous circuit printing techniques, which can allow sensing device 110 to be attached to circuit breaker panel 190 as a sticker.

In several embodiments, sensing device 110 can include one or more magnets 117. In a number of embodiments, magnets 117 can be permanent magnets, such that magnets 117 can create a persistent magnetic field. In various embodiments, the one or more magnetic field sensors (e.g., 111-114) can be surrounded by magnets 117. In various embodiments, the magnets 117 can be placed to reduce the effect of magnetic nonlinearity of the sheet metal of panel 196 located in between main electrical power conductors 193, 194, and 195, and magnetic field sensors 111-114. The time difference between the actual current waveform flowing in main electrical power conductors 193, 194, and/or 195, and the magnetic waveform sensed by magnetic field sensors 111-114 can be dependent upon the magnetic saturation and permeability of the material of panel 196. Saturating the magnetic field with magnets 117 can reduce the nonlinearity induced by the sheet metal if panel 196. In other words, the nonlinearity of the phase difference between the actual and sensed waveform can be reduced by surrounding magnetic field sensors 111-114 with magnets 117, which beneficially result in more accurate predictions of the phase angle calculation, as discussed below in further detail.

In a number of embodiments, sensing device 110 can include an attachment mechanism 219. Attachment mechanism 219 can be configured to attach sensing device 110 to a surface of circuit breaker panel 190, such as panel 196. In some examples, attachment mechanism 219 can include an adhesive, a hook-and-loop material, a magnet, or another attachment mechanism.

In various embodiments, sensing device 110 can include a transmitter 215 and/or power source 216, which can be used to transmit one or more signals for the magnetic fields sensed by magnetic field sensors 111-114. For example, transmitter 215 can be a wired or wireless channel. For example, transmitter 215 can communicate using a communication protocol, such as Wi-Fi (wireless fidelity, the IEEE (Institute of Electrical and Electronics Engineers) 802.11 standard), Zigbee (IEEE 802.15.4), Bluetooth (IEEE 802.15.1), or another suitable protocol, such as a proprietary data communication protocol. In some embodiments, power source 216 can be a battery or other suitable power source, and can provide electrical power for transmission through transmitter 215.

Still referring to FIGS. 1-2, in many embodiments, calibration device 180 can include an electrical plug 282, which can be plugged into a receptacle in the structure, such as receptacle 164 or 168, and which can allow calibration device to be electrically coupled to a branch circuit, such as branch circuit 161 and/or branch circuit 167. In some embodiments, system 100 can include a single calibration device 180. In other embodiments, system 100 can include more than one calibration device, such as calibration device 180. For example, a first calibration device (e.g., 180) can be electrically coupled on the first phase branch (first leg) of electrical power infrastructure 160 and a second calibration device (e.g., 180) can be electrically coupled on the second phase branch (second leg) of electrical power infrastructure 160. In many embodiments, calibration device 284 can include a transceiver 284, which can be used to receive communications to control calibration device 180. For example, transceiver 284 can be a wired or wireless channel, and/or can communicate using a communication protocol, such as Wi-Fi, ZigBee, Bluetooth, or another suitable protocol.

In many embodiments calibration device 180 can include a load control unit 283 and a load unit 281. Load unit 281 can include one or more calibration loads and/or one or more switches. The switches can be mechanical relay switches, solid state relays, triacs, transistors (e.g., field effect transistors (FETs), silicon-controlled rectifiers (SCRs), bipolar junction transistors (BJTs), insulated-gate bipolar transistors (IGBTs), etc.), or another suitable controllable switching device. Through the use of the switches, the one or more calibration loads can be temporarily electrically coupled to a branch circuit (e.g., 163 or 167) of electrical power infrastructure 160 of the structure to facilitate calibration of sensor 110 and/or system 100.

The calibration loads in load unit 281 can be one or more resistors and/or one or more reactive loads, such as an inductor or capacitor with or without a resistive component. Additionally, the calibration load can be a load with a variable resistance. As an example, the calibration loads can be four high wattage resistors, such as Ohmite chassis mount resistors, part number TGHLVR100JE, which can be connected in series and/or parallel combinations via the switches.

In a number of embodiments, load control unit 283 can include a microcontroller to receive communications from transceiver 284 and/or can send signals to the switches of load unit 281 to drive the relays. The switching signal can be used to temporarily complete a branch circuit (e.g., 163, 167) and switch one or more calibration loads on to complete a circuit and draw power through main electrical power conductors 193, 194, and/or 195. For example, the load control unit can drive the switches to provide 25 watt (W), 100 W, 200 W, and/or 300 W loads. The one or more calibration devices (e.g., 180) can draw one or a series of known loads to automatically calibrate the sensing device 110 and/or system 100. In a number of embodiments, the maximum load that can be drawn by calibration device 180 is 1000 W. In another embodiment, the maximum load that can be drawn by calibration device 180 is 300 W. In yet other embodiments, the maximum load that can be drawn by calibration device 180 is 50 W. The relatively small maximum loads drawn by calibration device 180 can beneficially allow calibration device to safely dissipate heat, reduce power consumption, and/or be provided in a small form factor. In many embodiments, system 100 can advantageously leverage the actual normal electrical activities occurring in the structure to pulls up to only 300 W through calibration device 180, but nonetheless, can calibrate sensor 110 and/or system 100 over the entire range of possible power usage in the structure, such as between 0 and 20 kW, and/or in small increments such as 10 W increments.

In some embodiments, calibration device 180 can include a voltage sensor 285. Voltage sensor 285 can be configured to sense the voltage of electrical power infrastructure 160 and/or sense the phase of the voltage of electrical power infrastructure 160, which can be measured through the connection of electrical plug 184 to electrical power infrastructure 160, such as receptacle 164. In various embodiments, the voltage and/or phase of the voltage sensed by voltage sensor 285 can be transmitted through transceiver 284. In many embodiments, system 100 can use the phase of the voltage to facilitate calculating real power.

Still referring to FIGS. 1-2, in many embodiments, display device 120 can include a power source 223. In some embodiments, power source 223 can be a battery or an electrical plug, such as electrical plug 128, which can provide power to display device 120. Electrical plug can be plugged into electrical power infrastructure 160, such as receptacle 168. In a number of embodiments, display device 120 can be configured to receive the output signal from sensing device 110 and/or the voltage information from calibration device 180 via transceiver 224. In various embodiments, display device 120 can send control signals to calibration device 180 via transceiver 224, such as signals to activate load unit 281. In various embodiments, transceiver 224 can be a wired or wireless channel, and/or can communicate using a communication protocol, such as Wi-Fi, ZigBee, Bluetooth, or another suitable protocol.

In some embodiments, display unit 120 can include a processing module 225, memory 226, and/or a display 121. In several embodiments, computational unit 120 can be a small form factor display device. In other embodiments, computational unit 120 can be a personal computer (PC). In various embodiments, display 121 can be configured to display information, such as power usage, and can be a monitor, a touchscreen, an liquid crystal display (LCD), or another suitable display. in various embodiments, display 121 can show the result of the techniques described herein to an end-user in a structure, such as a home.

In a number of embodiments, processing module 225 can be one or more processing units, such as the MSP430 microcontroller manufactured by Texas Instruments, Inc. In another embodiment, processing module 225 can be a digital signal processor such as the TMS320VC5505 digital signal processor manufactured by Texas Instruments, Inc. or a Blackfin digital signal processor manufactured by Analog Devices, Inc.

In some embodiments, processing module 225 can be configured to use current measurements from sensing device 110 to determine a calibration of sensing device 110 and determine electrical power usage in electrical power infrastructure 160 of the structure, such as the electrical current and/or electrical power of main electrical power conductors 193, 194, and 195. In some examples, processing module 225 can execute one or more modules of computer instructions stored in memory 226, such as neural network module 222, transfer function module 229, phase angle module 228, and/or power consumption module 227, described below in greater detail. Memory 226 can be one or more non-transitory data storage elements.

Figure 3:
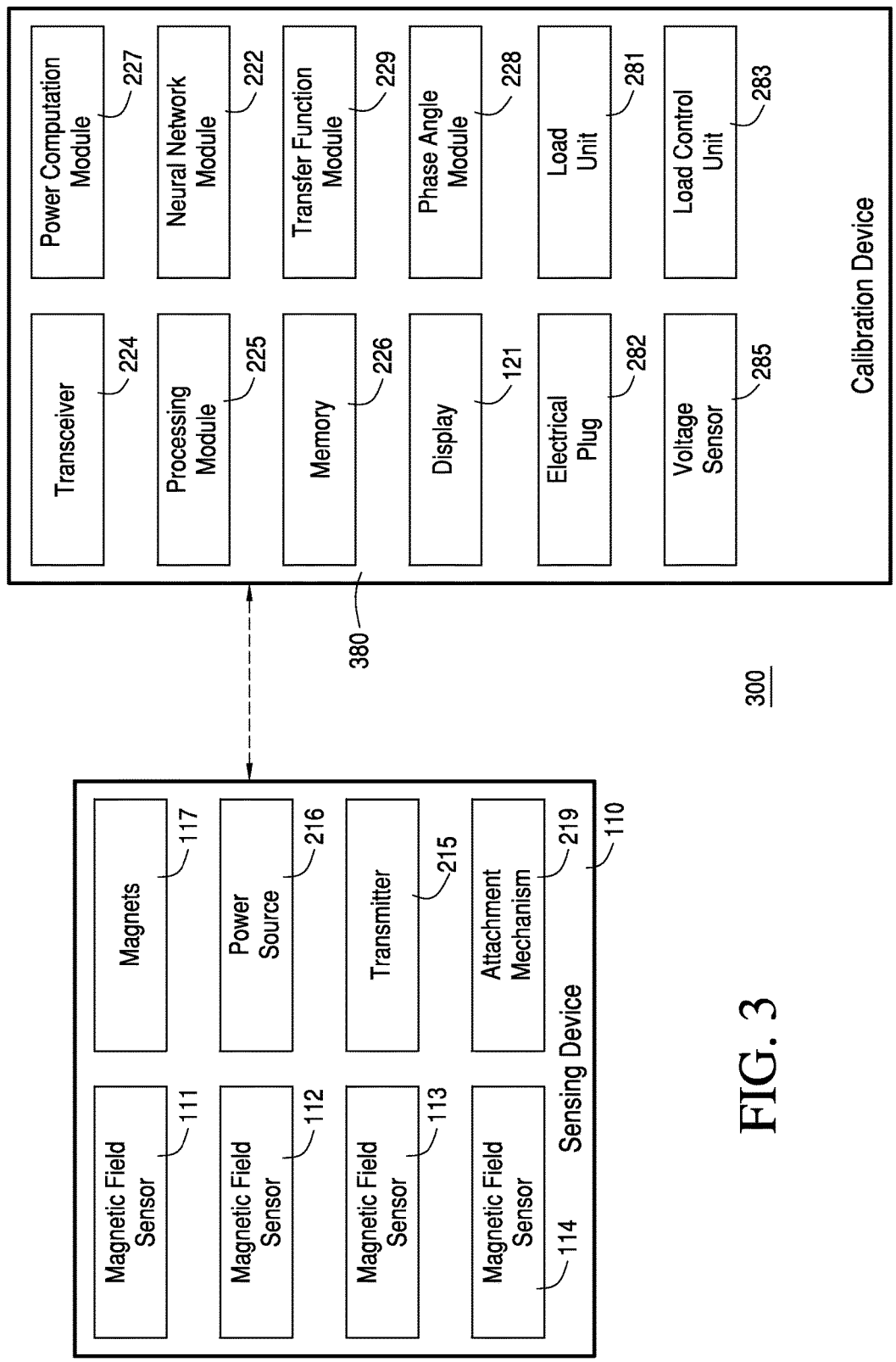
FIG. 3 illustrates a block diagram an exemplary system, according to a second embodiment.

Turning ahead in the drawings, FIG. 3 illustrates a block diagram an exemplary system 300, according to a second embodiment. System 300 is merely exemplary and is not limited to the embodiments presented herein. System 300 can be employed in many different embodiments or examples not specifically depicted or described herein. System 300 can be similar or identical to system 100 (FIGS. 1-2), and various components of system 300 can be similar or identical to various components of system 100 (FIGS. 1-2). In various embodiments, system 300 can include sensing device 110 and a calibration device 380. In many embodiments, calibration device 380 can include various elements and/or perform various functionalities of calibration device 180 (FIGS. 1-2) and display device 120 (FIGS. 1-2). For example, calibration device 380 can include load unit 281, load control until 283, voltage sensor 285, and electrical plug 282 from calibration device 180 (FIGS. 1-2), and can include processing module 225, memory 226, display 121, neural network module 222, transfer function module 229, phase angle module 228, and power consumption module 227 of display device 120 (FIGS. 1-2). In various embodiments, two or more elements of calibration device 180 (FIGS. 1-2) and display device 120 (FIGS. 1-2) can be combined as a single element in calibration device 380. For example, transceiver 284 (FIG. 2) can be combined in transceiver 224 in calibration device 380. As another example, power source 223 in display device 120 (FIG. 2) can be combined in electrical plug 282 of calibration device 380.

Referring to FIGS. 1-3, magnetic field sensors 111-114 can each sense a magnetic field generated from main electrical power conductors 193, 194, and/or 195 underlying circuit breaker panel 190, and can generate an output signal representing the magnetic field. The output signal generated by magnetic field sensor 111 is denoted herein as $S_1$. The output signal generated by magnetic field sensor 112 is denoted herein as $S_2$. The output signal generated by magnetic field sensor 113 is denoted herein as $S_3$. The output signal generated by magnetic field sensor 114 is denoted herein as $S_4$. To convert the sensed magnetic field to current, system 100 and/or system 300 can use a transfer function, which can, given the sensed magnetic flux, determine what the underlying current flow in the main leg is that induces the flux. System 100 and/or system 300 can infer the transfer function using calibration device 180 (FIGS. 1-2) and/or calibration device 380 (FIG. 3), which can draw a known amount of current by powering a resistive load in load unit 281 at a given time while the magnetic field sensors (e.g., 111-114) sense the change occurring in the magnetic field due to that current draw.

In many embodiments, system 100 and/or system 300 can generate a transfer function, which can be used to convert these magnetic fields signals into current waveforms flowing through each of main electrical power conductors 193, 194, and/or 195. In order to predict real power, system 100 and/or system 300 can determine both the root-mean-squared (RMS) value of the current waveform and phase angle between the current and voltage waveform, rather than merely the RMS value of the current.

Creating a transfer function to compute the current waveform given the magnetic flux can be non-trivial because of various challenges posed by fundamental characteristics of circuit breaker panel 190 and the sensed magnetic field. A first challenge can be stray magnetic flux. In addition to main electrical power conductors 193, 194, and/or 195, circuit breaker panel 190 also consists of other electrical wires going through the individual circuit breakers (e.g., 161, 165). There are also wires passing around the main lines and each of those can radiate fair amount of magnetic field depending on the current flowing through them. Magnetic field sensor 111-114 can sense the magnetic field radiated from all these sources. In order to use determine only the magnetic field radiated by the main lines, the magnetic fields radiated by the surrounding wires should be eliminated during the prediction by the transfer function identifying only the magnetic flux radiated from main electrical power conductors 193, 194, and/or 195.

A second challenge can be the position of sensing device 110. The amount of magnetic field sensed by magnetic field sensors 111-114 can depend on the distance between magnetic field sensors 111-114 and main electrical power conductors 193, 194, and/or 195. In order for system 100 and/or system 300 to be a placement invariant system that allows sensing device 110 to be placed on any position of the breaker panel, the transfer function should be able to accommodate any distance between magnetic field sensors 111-114 and main electrical power conductors 193, 194, and/or 195.

A third challenge can be isolating the magnetic flux of each of main electrical power conductors 193, 194, and/or 195. Current flowing through each of main electrical power conductors 193, 194, and/or 195 can contribute to the sensed magnetic field of each of magnetic field sensors 111-114. Yet sensor 110 does not know a priori how much of the magnetic field generated by each of main electrical power conductors 193, 194, and/or 195 contributes to each of the magnetic fields sensed by magnetic field sensors 111-114. As shown in FIG. 1, magnetic field sensor 111 (the leftmost sensor) and magnetic field sensor 114 (the rightmost sensor) are likely influenced mostly by the leftmost leg (main electrical power conductor 193) and the rightmost leg (main electrical power conductor 195), respectively. But the ratio of influence is unknown a priori. For magnetic field sensors 112-113 (the two middle sensors), the scenario can be even more unpredictable. The transfer function should be able to figure out the ratio by which each of main electrical power conductors 193, 194, and/or 195 influences each of magnetic field sensors 111-114.

A fourth challenge can be uncertainty in the wiring of the circuit breaker panel (e.g., circuit breaker panel 190). Despite guidelines promulgated by NEMA and NEC, the internal wiring of breaker panels varies significantly depending on various factors, such as the skill and/or experience of the electrician who installed it. The transfer function should be able to work with any breaker panel with any type of wiring.

Because these challenges can vary across different breaker panels, the same amount of electrical load can induce different amounts of magnetic field in different panels. Moreover, even in the same panel with the same positioning of sensing device 110, the relationship between the amount of electrical load and the magnetic field can depend on the existing magnetic field inside circuit breaker panel 190 as a whole. For example, the baseline current through one of main electrical power conductors 193, 194, or 195 can be $I_1$ and a positive change of $I_{ch}$ amount can result in a positive change of $S_{ch1}$ in $S_1$. If the baseline current changes to $I_2$, the same positive $I_{ch}$ change can cause a different amount of change $S_{ch2}$. Depending on how the magnetic fields radiated from different wires and their constructive or destructive interference, the value of $S_{ch2}$ can even be negative despite a positive $I_{ch}$ value.

Accordingly, the relationship between the electrical current in main electrical power conductors 193, 194, and/or 195, and the magnetic field sensed by magnetic field sensors 111-114 can be nonlinear and/or can depend on the existing baseline magnetic field and/or the presence of other magnetic fields. To accommodate this variability and nonlinearity, system 100 and/or system 300 can create multiple polynomial equations for each "state" of the breaker panel. By defining the state in terms of magnetic flux, system 100 and/or system 300 can build a function for each state. Such a problem can be well suited for machine-learning techniques that learn a function with given states as inputs. For example, system 100 and/or system 300 can use a neural network model, which can essentially learn a polynomial function to predict output from input.

In a number of embodiments, neural network module 222 can construct a neural network model using load unit 281. As described above, calibration device can apply various loads, such as cycling through a series of 25 W, 100 W, 200 W, and 300 W loads. Just before the calibrator turns on a load, neural network module 222 can start tracking the values measured by sensing device 110. Turning the load on causes a change in the total current and, thus, the magnetic flux. This change in magnetic flux can be recorded by system 100 and/or system 300. For each calibrator action (e.g., turning on or turning off a load through load unit 281), neural network module 222 can construct a training instance for the neural network. The structure of such an instance is shown in Table 1. The first eight columns of every row can be input features of the learning algorithm. The ninth column can be the output value that the algorithm will try to learn. The neural network can consist of one input layer, one output layer, and two hidden layers having five neurons in each of the layers. In many embodiments, neural network module 222 can use a conventional neural-network machine-learning algorithm with the inputs and outputs described herein to learn the function.

TABLE 1

| $S_{1p}$ | $S_{1c}$ | $S_{2p}$ | $S_{2c}$ | $S_{3p}$ | $S_{3c}$ | $S_{4p}$ | $S_{4c}$ | $I_{ch}$ |
| --- | --- | --- | --- | --- | --- | --- | --- | --- |

In Table 1, $S_{1p}$, $S_{2p}$, $S_{3p}$, and $S_{4p}$ can be the RMS values of the four output signals generated by magnetic field sensors 111-114, respectively, before the calibrator turns on the load. $S_{1c}$, $S_{2c}$, $S_{3c}$, and $S_{4c}$ can be the RMS values of the four output signals generated by magnetic field sensors 111-114, respectively, after the calibrator turns on the load. $I_{ch}$ can be the amount of current the calibrator added to a leg (one of main electrical power conductors 193, 194, or 195) when it is plugged in. Because the relationship between magnetic flux change and electrical current change can depend on the existing magnetic flux present in circuit breaker panel 190, in many embodiments neural network module 222 can use both the previous and the current magnetic flux as input features instead of merely using the change of flux.

In a number of embodiments, calibration device 180 can turn on each load of load unit 281 for five seconds. After five seconds, calibration device 180 can turn off the load of load unit 281, and neural network module 222 can captures a similar event and calculate a similar training instance for the turn-off event. In many embodiments, system 100 and/or system 300 does not have access to the absolute value of the current going through each of main electrical power conductors 193, 194, and/or 195. In several embodiments, the only a priori information can be the amount of current change calibration unit 180 causes in main electrical power conductors 193, 194, and/or 195. Consequently, in many embodiments the neural network model can be trained to predict only the change in current value, not the absolute current value.

To predict the absolute current waveform in each of main electrical power conductors 193, 194, and/or 195, transfer function module 229 can use a geometric translation technique that can leverage the prediction model and natural electrical activities in a home to create a transfer function that converts sensor values to current waveform. For the sake of simplicity, the description of the technique below uses only one, instead of four, magnetic field sensor (e.g., 111-114), and only a single leg (one of main electrical power conductors 193, 194, and/or 195).

At first, system 100 (FIGS. 1-2) and/or system 300 (FIG. 3) can create an initial transfer function using the collected calibration data generated by neural network module 222 (FIGS. 2-3). The transfer function can work for only a small range of magnetic field values, which can be limited to the range of loads the calibration device (e.g. 180 (FIGS. 1-2), 380 (FIG. 3)) can provide. This range can be stored as a calibrated region, while keeping track of the present magnetic sensor values. As the magnetic sensor values change over time as appliances are used in the structure, system 100 (FIGS. 1-2) and/or system 300 (FIG. 3) can use the calibration device (e.g. 180 (FIGS. 1-2), 380 (FIG. 3)) to calibrate un-calibrated regions, by the calibration device pulling a small load. The difference in the observed magnetic field signal at that level can be used to update the transfer function.

In many embodiments, when system 100 and/or system 300 begins to calibrate sensor 110, the only information known is the current RMS magnetic field ($S_k$) measured by each magnetic field sensor. Calibration device 180 can initially draw a series of 100 W, 200 W, and 300 W loads (3 times each) on top of this current magnetic field. Hence the field value can change and the system can keep track of the maximum value of the sensor ($S_{k+1}$). Based on these three loads being repeated three times, neural network module 222 can save nine calibration events from $S_k$ to $S_{k+1}$. For each event, there can be two training instances (e.g., one for turning the load on ("on event") and one for turning the load off ("off-event")), as described above. As such, neural network module 222 can gather eighteen training instances from sensor value of $S_k$ to $S_{k+1}$ and use these instances to train the neural network model described earlier.

Figure 4:
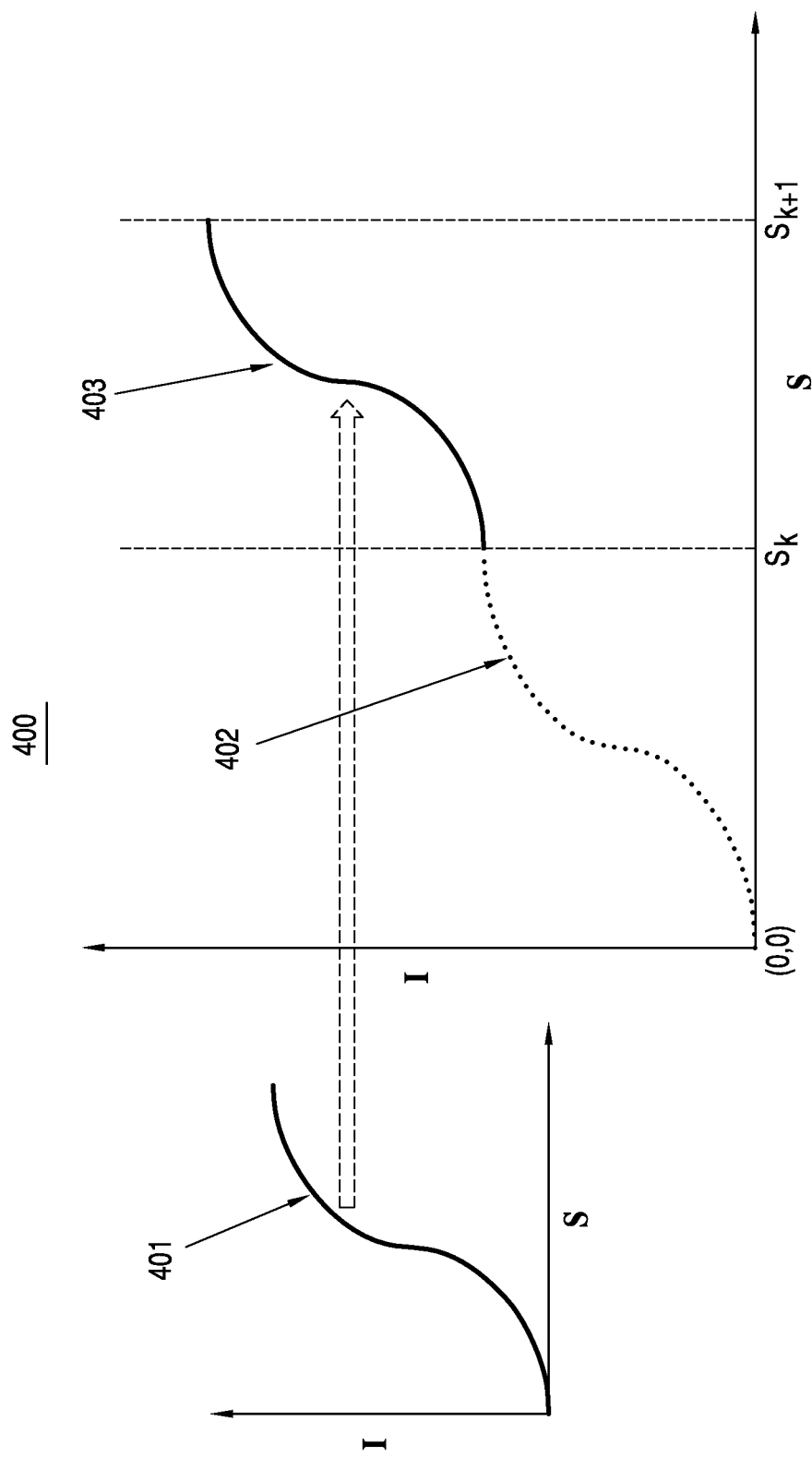
FIG. 4 illustrates an exemplary graph of a function, which can be derived by placing a predicted function a region of the function, according to an embodiment.

Turning ahead in the drawings, FIG. 4 illustrates an exemplary graph of a function (F) 400, which can be derived by placing a predicted function ($F_k$) 401 in a region 403 of function (F) 400. In many embodiments, the predicted function ($F_k$) 401 that can convert magnetic field change value from $S_k$ to $S_{k+1}$ to current value $I_{ch}$. By training the neural network model, neural network module 222 (FIGS. 2-3) can determine predicted function 401 ($F_k$), which can convert the magnetic field change value from $S_k$ to $S_{k+1}$ to the current change value $I_{ch}$. In order to find function (F) 400, which can convert any magnetic field value S to absolute current value I, predicted function 401 ($F_k$) can be placed into an appropriate position of F. Because system 100 (FIGS. 1-2) and/or system 300 (FIG. 3) does not know the absolute value of I, transfer function module 229 (FIGS. 2-3) can assume a random y-axis value R and place predicted function 401 on function (F) 400 at region 403 of ($S_k$, R). In many embodiments, system 100 (FIGS. 1-2) and/or system 300 (FIG. 3) does not know how the function (F) 400 looks like at a region 402 from 0 to $S_k$. Therefore function (F) 400 can be extrapolated at region 402 from (0, 0) to ($S_k$, R). Because region 402 of function (F) 400 is extrapolated, it can do a poor job in translating S to I.

Figure 5:
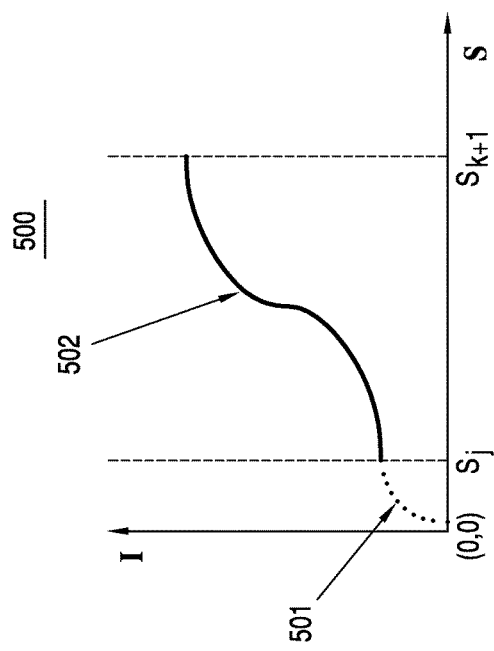
FIG. 5 illustrates an exemplary graph of a function, according to an embodiment.
Figure 6:
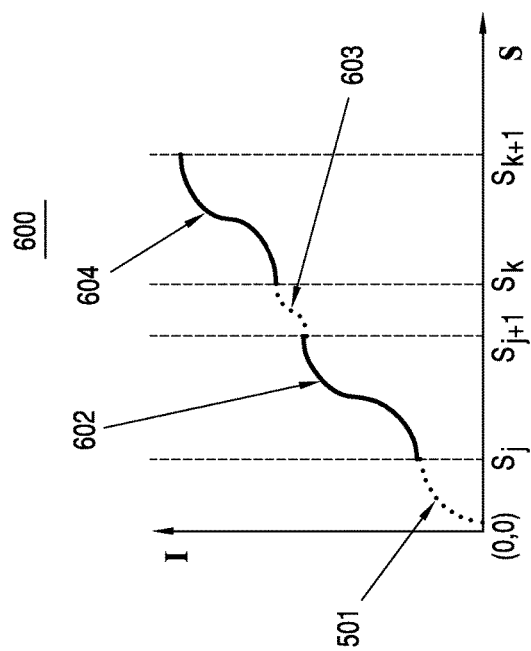
FIG. 6 illustrates an exemplary graph of a function, according to an embodiment.
Figure 7:
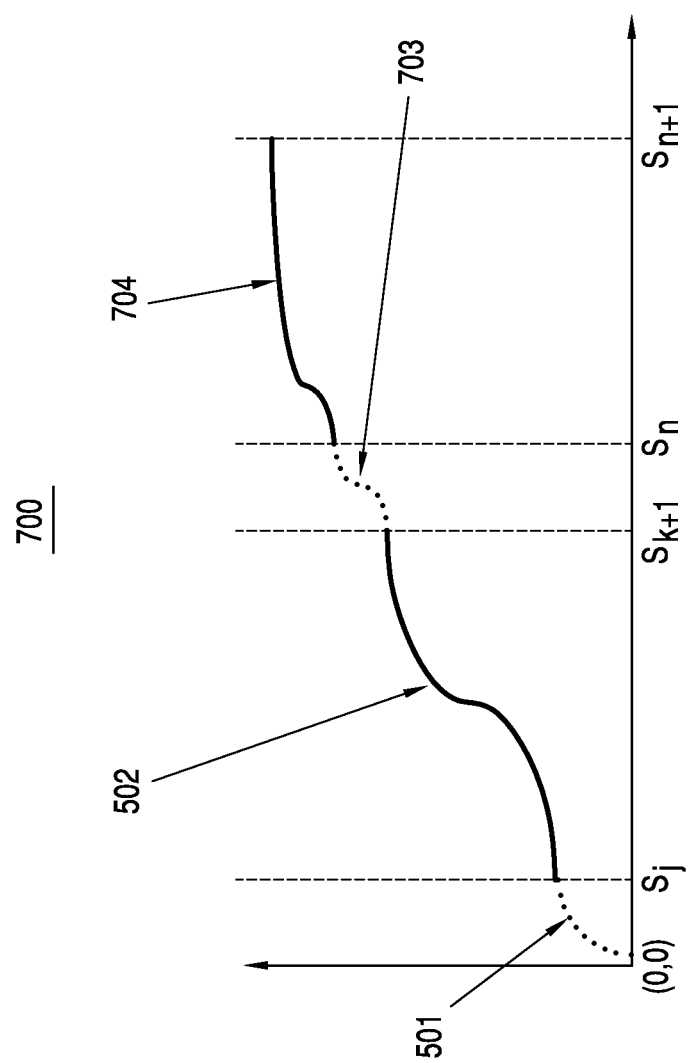
FIG. 7 illustrates an exemplary graph of a function, according to an embodiment.

Turning ahead in the drawings, FIG. 5 illustrates an exemplary graph of a function (F) 500. FIG. 6 illustrates an exemplary graph of a function (F) 600. FIG. 7 illustrates an exemplary graph of a function (F) 700. In many embodiments, function (F) 500, function (F) 600, and/or function (F) 700 can be a further refinement of function (F) 400 (FIG. 4), based on additional calibration sequences. In many embodiments, in order to further determine extrapolated region 402 (FIG. 4), transfer function module 229 (FIGS. 2-3) can wait until the value of S, as measured by the magnetic field sensor (e.g., 111-114 (FIGS. 1-3) falls below $S_k$ into position 402 (FIG. 4), at which point the calibration process can be reinitiated. As described above, neural network module 222 (FIGS. 2-3) can determine a new function ($F_j$) based on the values measured in the calibration sequence, which can converts magnetic field values from $S_j$ to $S_{j+1}$, where $S_j < S_k$. For cases in which $S_k \leq S_{j+1}$, transfer function module 229 (FIGS. 2-3) can combine $F_j$ with $F_k$ and create a new region 502 of function (F) 500 that covers from $S_j$ to $S_{k+1}$, as shown in FIG. 5. Otherwise, in cases in which $S_k > S_{j+1}$, transfer function module 229 (FIGS. 2-3) can place $F_j$ in a region 602 (which covers the range from $S_j$ to $S_{j+1}$), which can be separate from $F_k$ in region 604 (which covers the range $S_k$ to $S_{k+1}$).

As shown in FIG. 5, transfer function module 229 (FIGS. 2-3) can create an extrapolated region 501 from 0 to $S_j$. If the measured magnetic field ever falls below $S_j$, such as during the night when most of the appliances are off, neural network module 222 (FIGS. 2-3) can initiate a new calibration cycle for the new region and transfer function module 229 (FIGS. 2-3) can further regine and/or recreate function (F) 500 from the new position to $S_{k+1}$.

As shown in FIG. 6, transfer function module 229 (FIGS. 2-3) can create extrapolated region 501 from 0 to $S_j$ and an extrapolated region 603 from $S_{j+1}$ to $S_k$. In case the measured value is $S_m$ where $S_{j+1} < S_m < S_k$, system 100 can trigger calibration device 180 (FIGS. 1-2) and/or system 300 can trigger calibration device 380 (FIG. 3) again so that neural network module 222 (FIGS. 2-3) and transfer function module 229 (FIGS. 2-3) can update function (F) 600 from $S_m$ to $S_{k+1}$. After updating function (F) 600, transfer function module 229 (FIGS. 2-3) can extrapolate from $S_{j+1}$ to $S_m$, as the transfer function module 229 (FIGS. 2-3) already has a function from $S_j$ to $S_{j+1}$, as shown in region 602.

As shown in FIG. 7, if more appliances within the structure are turned on and the sensor value ($S_n$) exceeds $S_{k+1}$, system 100 can trigger calibration device 180 (FIGS. 1-2) and/or system 300 can trigger calibration device 380 (FIG. 3) again so that neural network module 222 (FIGS. 2-3) and transfer function module 229 (FIGS. 2-3) can update function (F) 500 (FIG. 6) to create function (F) 700, as updated in a region 704 from $S_n$ to $S_{n+1}$. After updating function (F) 700, transfer function module 229 (FIGS. 2-3) can extrapolate in a region 703 from $S_{k+1}$ to $S_n$, as transfer function module 229 (FIGS. 2-3) already has a prediction function in region 502 from $S_j$ to $S_{k+1}$. As time goes by and more appliances within the structure are turned on and/or off, which can result in additional calibration sequences, the extrapolated regions (e.g., 501, 703) can shrink more and more and transfer function module 229 (FIGS. 2-3) can refine a better translation function (e.g., function 400, 500, 600, or 700) from S to I. As system 100 (FIG. 1) and/or system 300 (FIG. 3) runs in a house, it can advantageously capture the usual electrical activities in the house, which can increasingly provide it with a wide range of sensor values to learn from using neural network module 222 (FIGS. 2-3). As more appliances are turned on and off, system 100 (FIGS. 1-2) and/or system 300 (FIG. 3) can calibrate for more and more ranges and the predicted transfer function (e.g., function 400 (FIG. 4), function 500 (FIG. 5), function 600 (FIG. 6), or function 700 (FIG. 7)) can become increasingly accurate.

Figure 8:
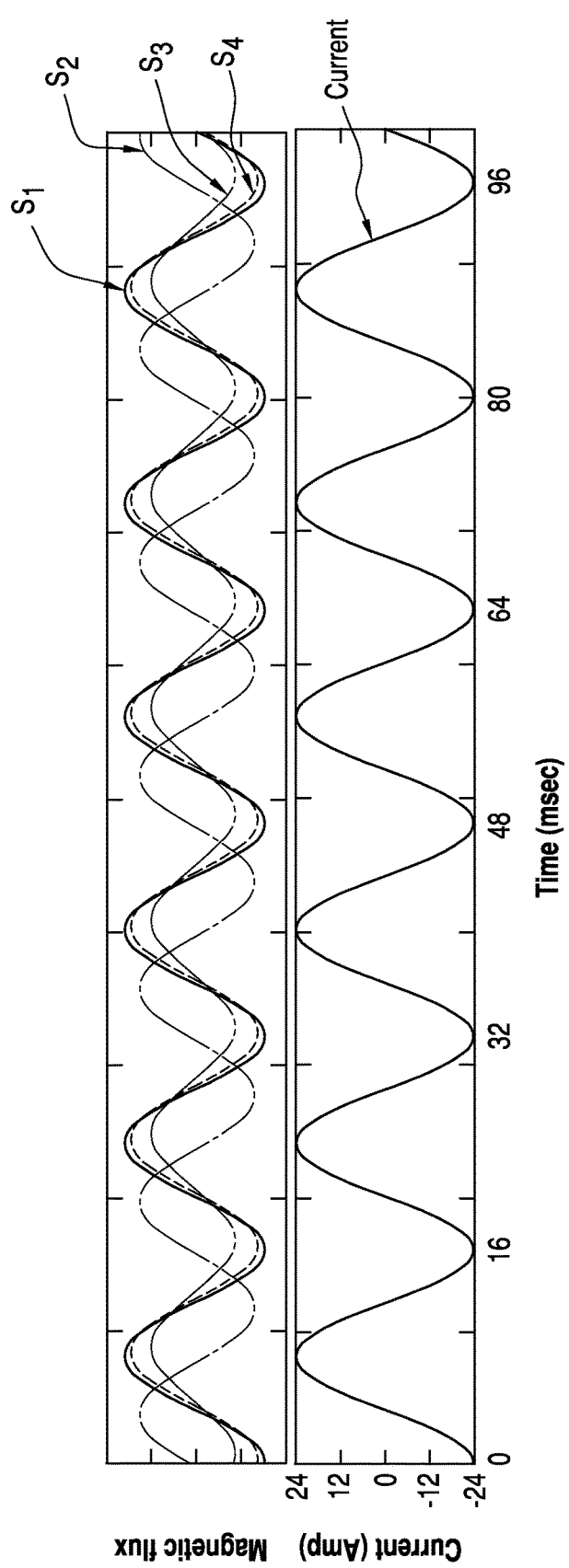
FIG. 8 (top) illustrates an exemplary graph of magnetic flux for output signals generated by magnetic field sensors and FIG. 8 (bottom) illustrates an exemplary graph of a corresponding predicted current waveform through one leg.

Turning ahead in the drawings, FIG. 8 (top) illustrates an exemplary graph of magnetic flux for output signals $S_1$, $S_2$, $S_3$, and $S_4$ generated by magnetic field sensors 111-114 (FIGS. 1-3) and FIG. 8 (bottom) illustrates an exemplary graph of a predicted current waveform I through one leg (e.g., one of main electrical power conductors 193, 194, and/or 195). Once system 100 (FIGS. 1-2) and/or system 300 (FIG. 3) starts, it can create a function F (e.g., function 400 (FIG. 4), function 500 (FIG. 5), function 600 (FIG. 6), or function 700 (FIG. 7)), which can takes the four magnetic field values ($S_1$, $S_2$, $S_3$, $S_4$) measured by magnetic field sensors 111-114 (FIGS. 1-3) and can translate them into current waveform I. FIG. 8 (top) shows a sample input and FIG. 8 (bottom) shows a corresponding sample output of the prediction function F.

As shown in FIG. 8, system 100 (FIGS. 1-2) and/or system 300 (FIG. 3) can predict the raw current waveform flowing through each leg (e.g., one of main electrical power conductors 193, 194, and/or 195). In other words, it can predict both the RMS current (I) and the phase of the current (I), which can be used to calculate the phase angle ($\theta$) between the line voltage and the current (I). Predicting this $\theta$ can be relevant from an energy monitoring perspective, as it can allow system 100 (FIGS. 1-2) and/or system 300 (FIG. 3) to determine the real power, as opposed to apparent power, consumed by the household.

Figure 9:
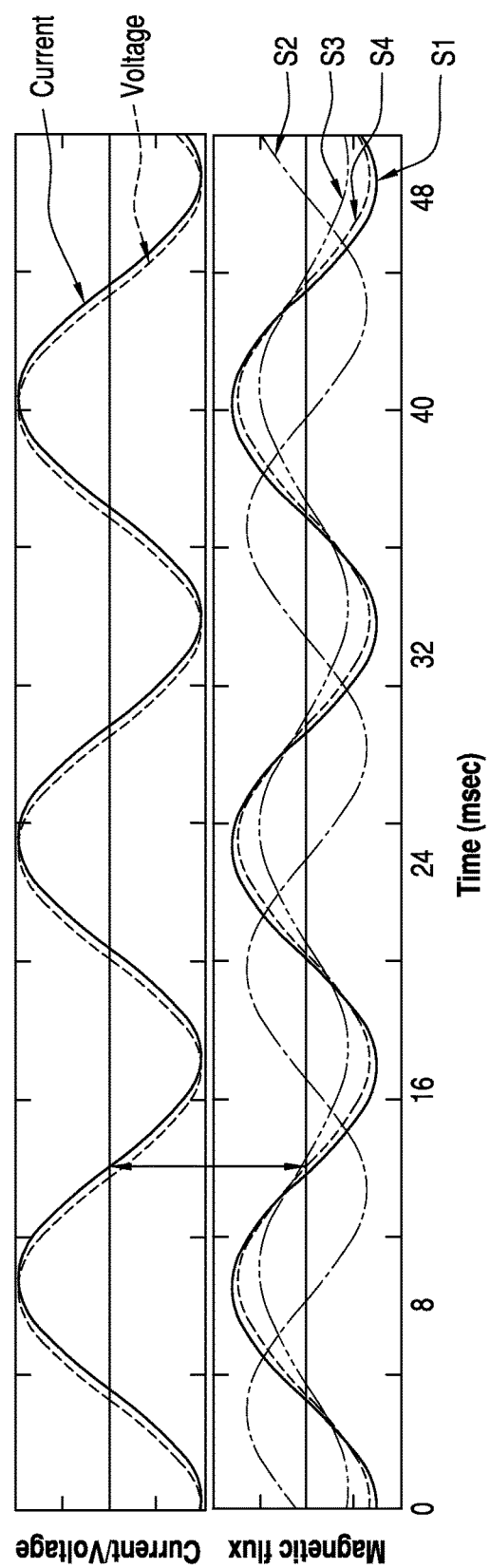
FIG. 9 (top) illustrates an exemplary graph of a predicted current waveform and a measured voltage waveform, and FIG. 9 (bottom) illustrates an exemplary graph of magnetic flux for output signals generated by magnetic field sensors that were used to predict the current waveform.

Turning ahead in the drawings, FIG. 9 (top) illustrates an exemplary graph of a predicted current waveform I and a measured voltage waveform, and FIG. 9 (bottom) illustrates an exemplary graph of magnetic flux for output signals $S_1$, $S_2$, $S_3$, and $S_4$ generated by magnetic field sensors 111-114 (FIGS. 1-3) that were used to predict the current waveform I. In many embodiments, the voltage waveform can be measured by voltage sensor 285 (FIGS. 2-3). To predict phase angle $\theta$, system 100 (FIGS. 1-2) and/or system 300 (FIG. 3) can rely on the hypothesis that "any change into the phase of the current waveform will also be reflected into the sensor waveform." FIG. 9 shows an example of the validity of the hypothesis. As shown in FIG. 9 (top), the measured voltage and predicted current waveforms are closely in phase with each other ($\theta$ is small). Careful inspection of FIG. 9 (bottom) shows that two of the magnetic waveforms ($S_1$ and $S_4$) have the same phase characteristics (zero crossing rise and fall at almost the same timestamps) as the current waveform. In other words, the transfer function (e.g., function 400 (FIG. 4), function 500 (FIG. 5), function 600 (FIG. 6), or function 700 (FIG. 7)) can be influenced more by magnetic field sensors 111 and 114 (FIGS. 1-3) when predicting current waveform.

Figure 10:
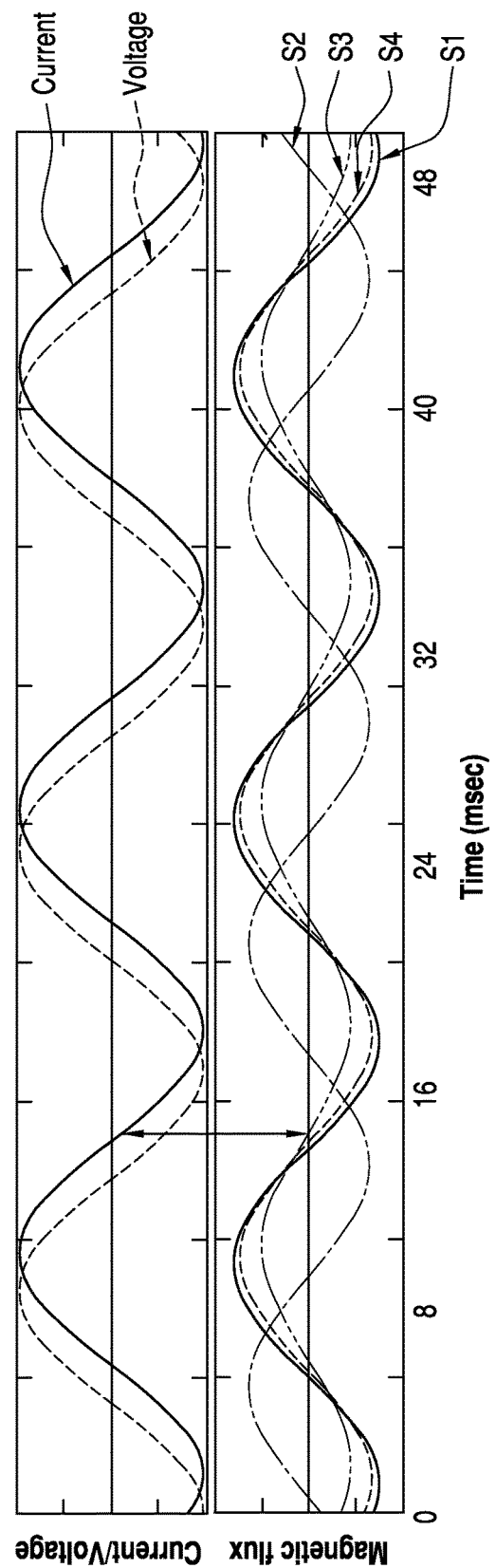
FIG. 10 (top) illustrates an exemplary graph of a predicted current waveform and a measured voltage waveform, and FIG. 10 (bottom) illustrates an exemplary graph of magnetic flux for output signals generated by magnetic field sensors that were used to predict the current waveform.

Turning ahead in the drawings, FIG. 10 (top) illustrates an exemplary graph of a predicted current waveform I and a measured voltage waveform, and FIG. 10 (bottom) illustrates an exemplary graph of magnetic flux for output signals $S_1$, $S_2$, $S_3$, and $S_4$ generated by magnetic field sensors 111-114 (FIGS. 1-3) that were used to predict the current waveform I. FIG. 10 (top) shows a different scenario in which the current waveform is lagging the voltage waveform by an angle $\theta$. As shown in FIG. 10 (bottom) From the bottom graph, two of the magnetic waveforms ($S_1$ and $S_4$) are also following the current waveform. In other words, when the current waveform is phase shifted by angle $\theta$, four sensor waveforms will also get phase shifted by some angles $\theta_1$, $\theta_2$, $\theta_3$, and $\theta_4$. These angles can be different from the original phase shift $\theta$. Yet the sensors that are influenced primarily by the current waveform can have a closer shift to the angle $\theta$. As such, a difference ($\theta_{diff}$) between the original shift and the sensed shift can be small.

In many embodiments, the presence of the sheet metal of panel 196 (FIG. 1) between of main electrical power conductors 193, 194, and/or 195, and magnetic field sensors 111-114 (FIGS. 1-3) can result in the phase difference ($\theta_{diff}$) between the actual current waveform going through main electrical power conductors 193, 194, and/or 195, and the magnetic waveform sensed by magnetic field sensors 111-114 (FIGS. 1-3) becoming a nonlinear function based on the magnetic saturation and permeability of the material. In a number of embodiments, magnets 117 (FIGS. 1-3) surrounding magnetic field sensors 111-114 (FIGS. 1-3) can advantageously saturate the magnetic field and reduce the nonlinearity effect. As a result, $\theta_{diff}$ can become near constant and the transfer function (e.g., function 400 (FIG. 4), function 500 (FIG. 5), function 600 (FIG. 6), or function 700 (FIG. 7)) can predict the phase angle with good accuracy.

In several embodiments, phase angle module 228 (FIGS. 2-3) can determine the phase difference and/or phase angle between the predicted current using the transfer function (e.g., function 400 (FIG. 4), function 500 (FIG. 5), function 600 (FIG. 6), or function 700 (FIG. 7)) generated by transfer function module 229 (FIGS. 2-3), and using the voltage measured by voltage sensor 285 (FIGS. 2-3). The phase angle can be equal to the phase angle of the predicted current minus the phase angle of the voltage measured using voltage sensor 285 (FIGS. 2-3), which can be used to determine the phase angle of the voltage across electrical power infrastructure 160 (FIG. 1). In several embodiments, the phase angle of the predicted current can be calculated in reference to the zero point crossing of the measured voltage. In a number of embodiments, power computation module 227 (FIGS. 2-3) can determine the real power based on the phase difference and/or phase angle. For example, the real power can be equal to the product of RMS values of the current and voltage and the cosine of the phase angle.

Figure 11:
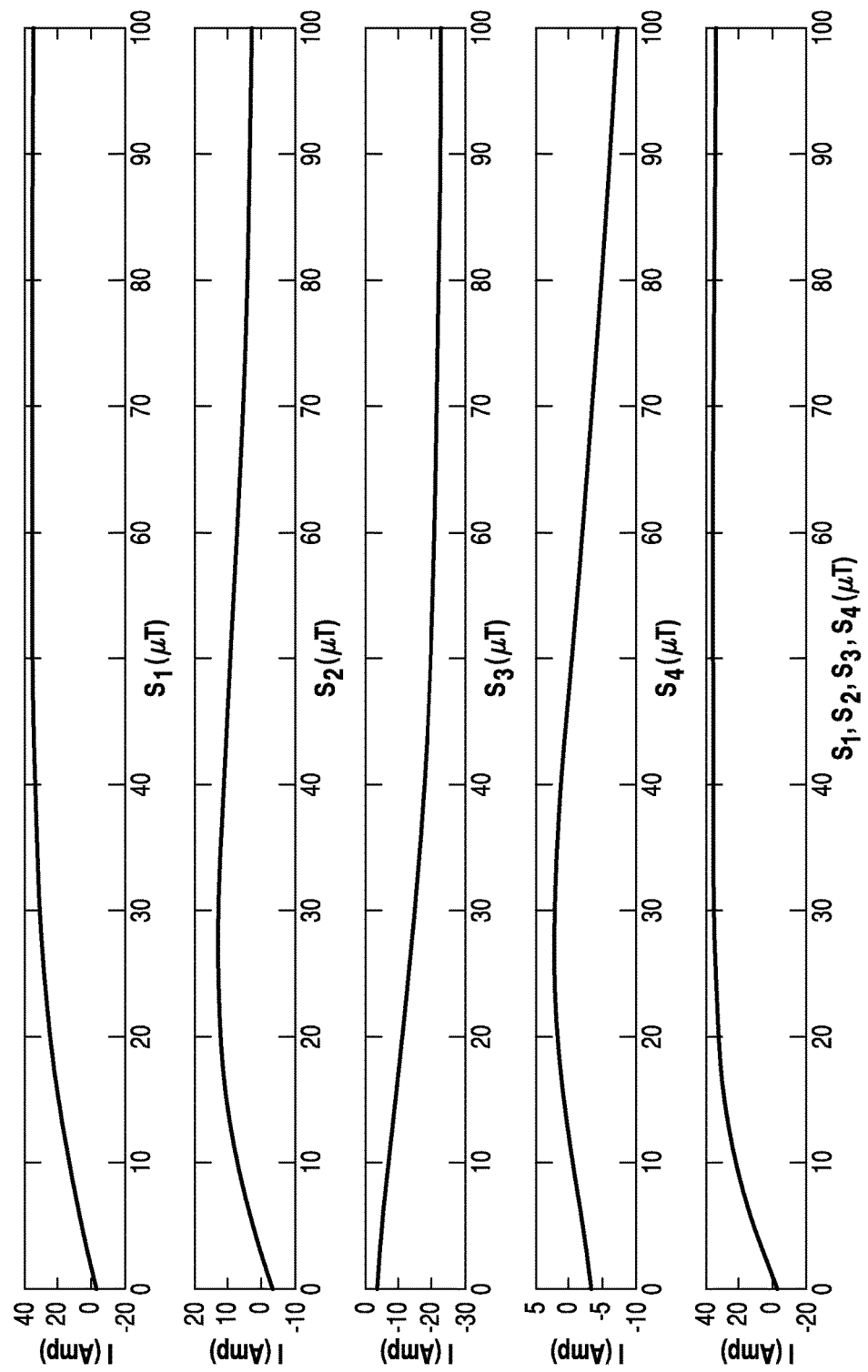
FIG. 11 illustrates exemplary graphs showing a transfer function and its decomposed elements.

Turning ahead in the drawings, FIG. 11 illustrates exemplary graphs showing a transfer function and its decomposed elements. Mathematically, the transfer function (e.g., function 400 (FIG. 4), function 500 (FIG. 5), function 600 (FIG. 6), or function 700 (FIG. 7)) can be expressed as follows: $I=F(S_1, S_2, S_3, S_4)$. As the function is five-dimensional (four inputs and one output), it can be challenging to visualize the effect of each of the magnetic field sensors (e.g., 111-114 (FIGS. 1-3)) on the predicted current output. The top four plots of FIG. 11 show the predicted current (I) based on each of a single sensor value ($S_1$, $S_2$, $S_3$, or $S_4$). For each of the first four plots, one sensor value ($S_1$, $S_2$, $S_3$, or $S_4$) is varied from 0 microtesla (μT) to 100 μT linearly, keeping all the other sensor values at 0 μT. The bottom plot of FIG. 11 shows the predicted current (I) based on all four sensor values. The bottom plot assumes all four sensors values increase from 0 μT to 0.05 μT. The current is measured in amperes (amp).

The plotting in FIG. 11 can be less than ideal, as in actual operation of system 100 (FIGS. 1-2) and/or system 300 (FIG. 3), the current can be predicted based on different combinations of all sensor values. Yet FIG. 11 can provide interesting insight. As an example, after a certain field value, the predicted current values go down for all the sensor values except $S_1$. This phenomenon is observed because of the presence of multiple magnetic waveforms inside panel 196 (FIG. 1). As the phases of these waveforms are different and they are always changing based on load condition, there can be constructive and destructive interferences in different locations inside panel 196 (FIG. 1). Depending on the location in which sensing device 110 (FIGS. 1-3) is placed on circuit breaker panel 190 (FIG. 1), the magnetic field sensors (e.g., 111-114 (FIGS. 1-3)) can sense destructive interferences when there is a positive change in the current waveform and can exhibit an inverse relationship between current and magnetic field.

In the bottom plot of FIG. 11, in which all the sensor values are increasing, there is a similarity with the topmost plot of FIG. 11 in which only $S_1$ is increasing. Although the predicted current (I) for the three other sensor values ($S_2$, $S_3$, and $S_4$) is decreasing after a while, the predicted current (I) is always increasing in the bottommost plot of FIG. 11. Essentially, this behavior means that the transfer function (FIG. 4), function 500 (FIG. 5), function 600 (FIG. 6), or function 700 (FIG. 7)) is influenced primarily by $S_1$. In other words, magnetic field sensor 111 (FIGS. 1-3) corresponding to sensor value $S_1$ can reflect the current waveform more precisely than the other magnetic field sensors 112-114 (FIGS. 1-3), which correspond to sensor values $S_2$, $S_3$, and $S_4$, respectively. For example, the neural network model learned by neural network module 222 (FIGS. 2-3) can increase the coefficient of $S_1$ more than $S_2$, $S_3$, and $S_4$. In such a case, the amplitude and phase of the predicted current can be determined primarily by $S_1$, which illustrates why a machine learning-based approach can be more appropriate for this kind of problem, as it can be difficult to fit a single polynomial for these observations.

To validate the techniques described herein, an evaluation was conducted in six different homes and one industrial building. The homes had two-phase wiring systems and the industrial building had a three-phase system. Data was collected from one house for a longer period, spanning seven days, and from the other places for a shorter period, spanning two days. The evaluation show the general applicability of system 100 (FIGS. 1-2) and/or system 300 (FIG. 3), and the techniques described herein, to a diverse set of breaker panels (e.g., circuit breaker panel 190 (FIG. 1)), as well as the longer-term temporal stability of these techniques. Table 2 shows the summary of the homes used in the evaluation, based on panel type, style, and size. H1-H6 are the six homes. H1 had the system deployed for 7 days. I1 is the industrial building.

TABLE 2

| ID | Panel type | Style/Built/Remodeled | Size/Floors |
|---|---|---|---|
| H1 | Two-phase | Apartment/1993/Not applicable (NA) | 550 square feet (sq. ft.)/1 floor |
| H2 | Two-phase | House/1972/2002 | 1250 sq. ft./1 floor |
| H3 | Two-phase | Apartment/1931/1994 | 800 sq. ft./1 floor |
| H4 | Two-phase | House/1960/NA | 2220 sq. ft./1 floor |
| H5 | Two-phase | House/1987/NA | 1340 sq. ft./1 floor |
| H6 | Two-phase | House/NA/NA | 1452 sq. ft./1 floor |
| I1 | Three-phase | Industrial/2003/NA | NA |

All of the data collection sessions were performed under a naturalistic setting with the usual home appliances comprising of inductive, resistive, and other complex harmonics appliances. The residents and/or occupants of the structures were not given any instructions on the use of their electrical appliances or requested to make any changes in their daily routines or household tasks. Once installed (e.g., once sensing device 110 (FIGS. 1-3) was attached to circuit breaker panel 190 (FIG. 1), calibration device 180 (FIGS. 1-2) was plugged into receptacle 164 (FIG. 1), and display device 120 (FIGS. 1-2) was plugged into receptacle 168 (FIG. 1)), the system ran automatically in the background for the entire data collection session with no human interaction at all.

The system was packaged such that it could be rapidly setup in a home. The sensing device (e.g., sensing device 110 (FIGS. 1-3)) was placed on a breaker panel (e.g., circuit breaker panel 190 (FIG. 1)) using double-sided tape. To collect the ground truth, we installed commercially available high end transformer-based split-core CTs (99% accurate) inside the breaker panel prior to installing our sensor unit on the outside of the breaker panel. Both the output of the sensing device and the output of the CT were collected using the same data acquisition device (DAQ), specifically National Instruments USB-6259 attached to a laptop computer (e.g., display device 120 (FIG. 1)).

Long extension cables were used to bring the receptacles of different phases branches closer to the laptop. Two calibration devices (e.g., 180 (FIGS. 1-2)) were plugged into the receptacles (e.g., 164, 168). The calibration devices and the data acquisition device were connected to a laptop. The laptop controlled the calibration device, recorded all the data from the data acquisition device, and performed all the algorithmic processing in real-time. The original and predicted waveforms were also recorded for post-experiment analysis. The software portion in the laptop was written in Matlab.

For each of the deployments, the RMS current value ($I_{RMS}$) was calculated in ampere, the RMS line voltage ($V_{RMS}$) was calculated in volts, and phase angle (θ) of the current waveform with respect to voltage was calculated in degrees every second. These quantities were recorded both for ground truth current waveform (measured from the CTs) and predicted current waveform (as predicted by the software modules). Finally, the real power consumption (P) was calculated for each of two main legs every second as follows: $P = V_{RMS} \times I_{RMS} \times \cos\theta$. During accuracy calculation, only the accuracy of the calibrated regions were considered. Yet after a certain time, most regions became calibrated and all of the data were taken into consideration.

The system was installed using two calibration device in each of the two different phases of the house. Based on the calibration data, two different functions $F_1$ and $F_2$ for two branch phases $P_1$ and $P_2$ respectively, were created. During the evaluation, the case of using just one calibrator in one of the phases was also considered. Thus, for each home, the accuracy was calculated for all three possible cases: using just one calibrator in $P_1$, using just one calibrator in $P_2$, and using both calibrators in both phases. During all of the deployments, both calibrators were installed in both of the phases all the time, and both of the functions $F_1$ and $F_2$ for $P_1$ and $P_2$, respectively, were recorded, but the laptop only used $F_1$ to predict current in both $P_1$ and $P_2$ and $F_2$ to predict current in both $P_1$ and $P_2$. Table 3 shows the summary of all the deployment results.

Table 3 shows that, through deployments in six homes and one industrial building, the predicted RMS current and phase angles have an accuracy of 96.0% and 94.3%, respectively. Overall, the average accuracy across all the deployments while using two calibrators is 95.0% in real-world naturalistic energy use. This shows the robustness of our system in predicting real power across different breaker panels and placement in real environment with natural electrical activities. The evaluation also confirmed that the system does not rely on the precision of placement of the sensing device. In all of the deployments in the evaluation, depending on the structure of the breaker, the accuracy remained unaffected by the placement of the sensing device.

Figure 12:
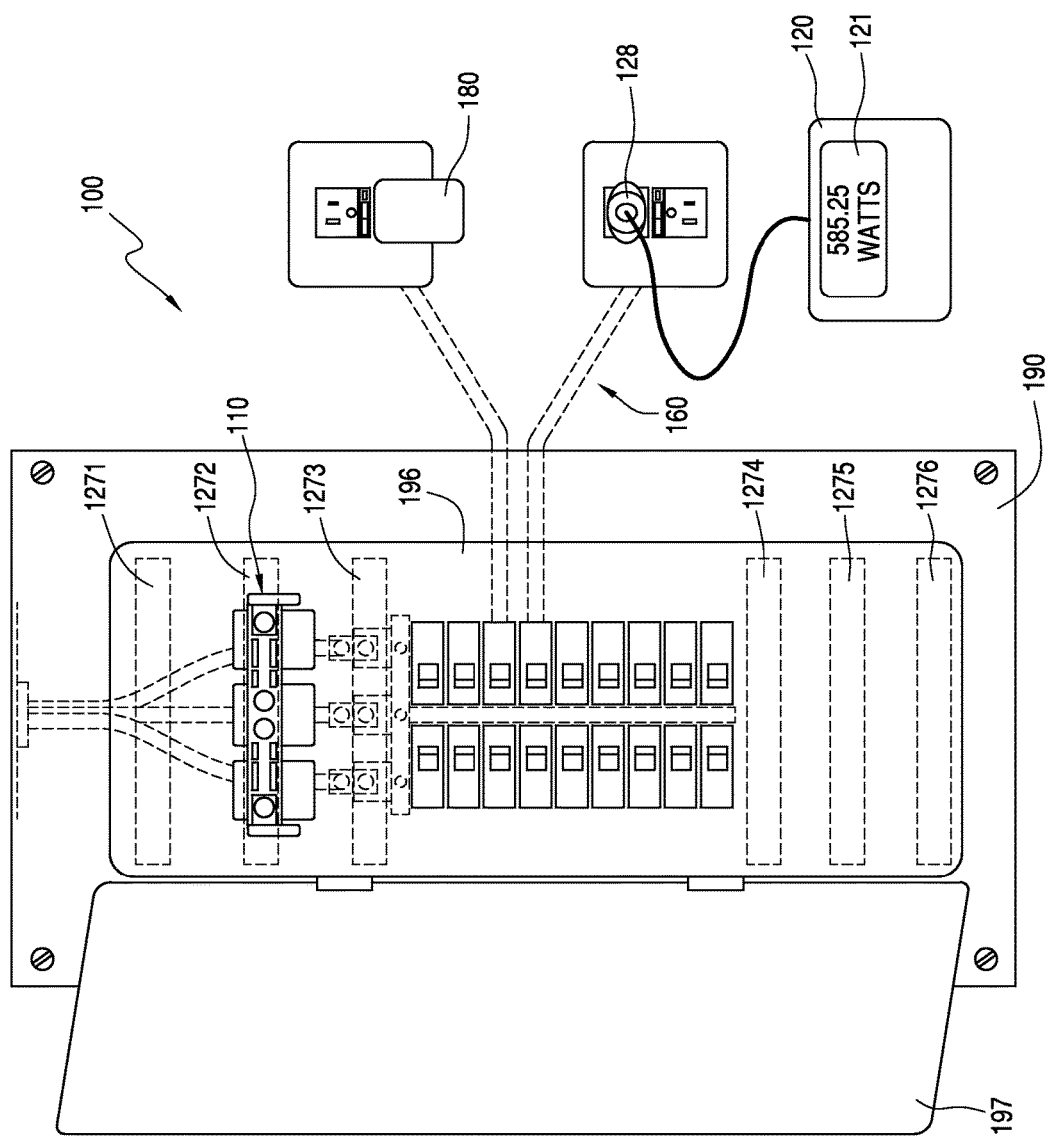
FIG. 12 illustrates a view of the system of FIG. 1 attached to circuit breaker and electrical power infrastructure, showing various sensor placement positions.

Turning ahead in the drawings, FIG. 12 illustrates a view of system 100 attached to circuit breaker 190 and electrical power infrastructure 160, showing various sensor placement positions. An experiment was conducted in a controlled environment to further analyze the positioning effect on accuracy. The controlled environment was used in order to prevent the accuracy from being affected by different electrical conditions. For the experiment, a sensing device (e.g., sensing device 110) was placed at 6 different locations on a breaker panel (e.g., circuit breaker panel 190), including position 1271, position 1272, position 1273, position 1274, position 1275, and position 1276. For each of the positions (e.g., 1271-1276), a controlled environment was maintained, as described below.

First, the environment was made to be electrically quiet, with no appliances being turned on or off, after which the baseline power consumption (C) of the environment was measured. Next, a 300 W load from the calibration device (e.g., 180) was turned on 3 times on top of the baseline to create a prediction function that works from C W to C+300 W. Next, a 100 W fan was turned on, which brought the baseline to C+100 W. Based on the prediction function that worked from C to C+300 W, the prediction function was expected to perform well for the 100 W fan load condition.

After 10 seconds, the 100 W fan load was turned off. Next, a 1300 W heater was turned on, and the same procedure as described above using the 300 W load from the calibration device was used to calibrate the system from C+1300 W to C+1600 W. Finally, keeping the 1300 W load on, a 500 W rice cooker was turned on, and the same calibration procedure was used to calibrate from C+1800 W to C+2100 W.

TABLE 4

| Position | Accuracy (%) |
|---|---|
| 171 | 97.7 |
| 172 | 98.2 |

TABLE 3

| | | | Accuracy Using Both Phase Calibration (%) | | | Accuracy Using Phase 1 Calibration (%) | | | Accuracy Using Phase 2 Calibration (%) | | |
|---|---|---|---|---|---|---|---|---|---|---|---|
| ID | Deployment time (hours) | Power Range (W-W) | $I_{RMS}$ (A) | cosθ | Power (W) | $I_{RMS}$ (A) | cosθ | Power (W) | $I_{RMS}$ (A) | cosθ | Power (W) |
| H1 | 168 | 252-4952 | 98.1 | 96.8 | 96.2 | 90.3 | 88.4 | 89.1 | 86.7 | 86.4 | 86.1 |
| H2 | 48 | 396-6840 | 95.6 | 97.7 | 96.7 | 89.2 | 84.7 | 86.6 | 91.3 | 85.9 | 87.7 |
| H3 | 48 | 598-6673 | 96.9 | 94.3 | 95.8 | 92.9 | 89.3 | 90.3 | 91.7 | 88.8 | 89.3 |
| H4 | 48 | 707-12373 | 97.2 | 95.3 | 96.0 | 90.4 | 85.5 | 87.4 | 85.3 | 81.0 | 84.9 |
| H5 | 48 | 441-5567 | 94.2 | 93.9 | 94.0 | 86.6 | 84.0 | 85.7 | 87.2 | 82.5 | 84.7 |
| H6 | 48 | 311-4110 | 93.3 | 90.8 | 91.2 | 87.4 | 82.1 | 83.1 | 88.1 | 86.4 | 86.7 |
| I1 | 48 | 1920-5982 | 96.8 | 91.6 | 95.2 | 83.1 | 78.3 | 80.1 | 84.3 | 81.1 | 82.9 |
| Aggregate | 456 | 252-12373 | 96.0 | 94.3 | 95.0 | 88.5 | 84.6 | 86.0 | 87.8 | 84.5 | 86.0 |

TABLE 4-continued

| Position | Accuracy (%) |
|---|---|
| 173 | 97.6 |
| 174 | 97.1 |
| 175 | 97.4 |
| 176 | 96.3 |

Table 4 shows the accuracy in each of the 6 positions. For all positions on the breaker panel, the minimum accuracy was 96.3%, with an average accuracy of 97.4%, despite the non-ideal position of the sensing device. This experiment confirmed that the approach described herein works independent of sensor position on the breaker panel with high accuracy.

The longer that a system (e.g., system 100 (FIGS. 1-2, 12) and/or system 300 (FIG. 3)) runs in a structure, the wider and more accurate the calibrated regions become. As the transfer function covers more of the power consumption range of the structure, the calibration frequency further decreases as well. As such, as long as the power consumption in the structure resides within the calibrated region, the calibration device (e.g., 180) can be turned off with little effect on the overall accuracy. An additional experiment was perform to verify this hypothesis.

First, the system was run for 24 hours in a home with all the existing appliances and the system calibrated for the region between 247 W-5344 W, yielding an overall accuracy of 95.7%. Next, the calibration device was turned off, and four new appliances were turned on. The four new appliances were two bulbs of 125 W and 250 W, one fan of 100 W, and a heater of 700 W, each having different load profiles than were used during calibration. The appliances were turned on both individually and in combination while keeping the total power consumption within the calibrated range. This experiment resulted in a small drop in accuracy to 94.2%. This experiment confirmed that even with the calibration device turned off and new appliances being introduced, the overall accuracy does not significantly deteriorate as long as the consumption resides within the previously calibrated region. Moreover, this experiment also shows that the generated function does not overfit based on existing appliances. Rather, it can be flexible enough to work with any new appliance as long as the total consumption does not exceed the calibrated region.

Low power factor loads such as Switch Mode Power Supply (SMPS) appliances can consume power in higher order harmonics of 60 Hz power. The sampling rate used in the experiments was 9.6 kHz, in which the sensing device can capture harmonic contents up to 4.8 kHz (79 harmonics). As such, the sensing device can be similar to a CT, in that both can need to be sampled at a high enough sampling rate to capture 60 Hz harmonics. The difference is that the sensing device (e.g., sensing device 110 (FIGS. 1-3, 12) described herein does not need to be around a live wire, and hence can be much easier to install. Because the sensing device is not attached to a live wire, it can need to learn the transfer function to convert the sensed magnetic field to the actual current flow.

An experiment was performed to understand how much power in a home can be attributed to the harmonics in order to design a sensing device that could considerably reduce the engineering costs by reducing the sampling rate and data bandwidth requirements. For a typical home over a period of a month, it was determined that the 60 Hz harmonics contribute to only 0.15% of total power, which suggests that a simpler sensing system could be designed when only total power measurement is of concern to the end user, albeit with an approximately 0.15% loss in accuracy.

To further investigate the accuracy of the system described herein with low power factor appliances, a seven-day deployment was performed in one of the homes with a bias towards SMPS appliances (two televisions, two laptops, an array of CFL bulbs, an active air conditioner, and frequent use of a microwave). This resulted in a small drop of $I_{RMS}$ and cos θ accuracy, yielding 95.9% and 90.0%, respectively. The total power accuracy was 92.2%. This experiment further confirms that the system also works with low power factor loads.

Figure 13:
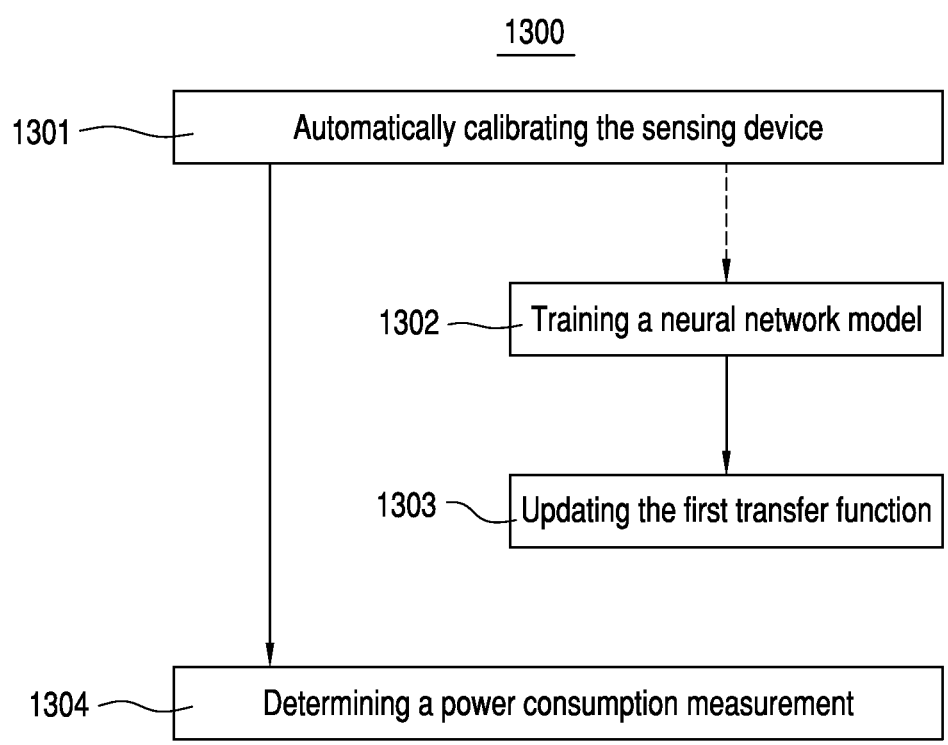
FIG. 13 illustrates a flow chart for a method of sensing electrical power being provided to a structure using a sensing device, a calibration device, and one or more processing modules, according to another embodiment.

Proceeding to the next drawing, FIG. 13 illustrates a flow chart for an embodiment of a method 1300 of sensing electrical power being provided to a structure using a sensing device, a calibration device, and one or more processing modules. Method 1300 is merely exemplary and is not limited to the embodiments presented herein. Method 1300 can be employed in many different embodiments or examples not specifically depicted or described herein. In some embodiments, the procedures, the processes, and/or the activities of method 1300 can be performed in the order presented. In other embodiments, the procedures, the processes, and/or the activities of the method 1300 can be performed in any other suitable order. In still other embodiments, one or more of the procedures, the processes, and/or the activities in method 1300 can be combined or skipped.

In some embodiments, the sensing device can be similar or identical to sensing device 110 (FIGS. 1-3, 12). In a number of embodiments, the calibration device can be similar or identical to calibration device 180 (FIGS. 1-2, 12) or calibration device 380 (FIG. 3). In many embodiments, the one or more processing modules can be similar or identical to processing module 225 (FIGS. 2-3). In various embodiments, the sensing device can include one or more magnetic field sensors. The magnetic field sensors can be similar or identical to magnetic field sensors 111-114 (FIGS. 1-3). In a number of embodiments, the sensing device can be attached to a panel of a circuit breaker box. For example, the panel can be similar or identical to panel 196 (FIGS. 1, 12), and the circuit breaker box can be similar or identical to circuit breaker panel 190 (FIGS. 1, 12). In various embodiments, the panel of the circuit breaker box can overlie at least a part of one or more main electrical power supply lines for an electrical power infrastructure of a structure. For example, the one or more main electrical power supply lines can be similar or identical to main electrical power conductors 193, 194, and/or 195 (FIG. 1). The electrical power infrastructure can be similar or identical to electrical power infrastructure 160 (FIGS. 1, 12). In some embodiments, the calibration device can include a load unit. The load unit can be similar or identical to load unit 281 (FIGS. 2-3). In various embodiments, the calibration device can be electrically coupled to the electrical power infrastructure of the structure. For example, the calibration device can be electrical coupled such as via electrical plug 282 (FIGS. 2-3).

Referring to FIG. 13, method 1300 can include a block 1301 of automatically calibrating the sensing device by determining a first transfer function in a piecewise manner based on a plurality of ordinary power consumption changes in the structure over a first time period. In some embodiments, the first transfer function can be similar or identical to function 400 (FIG. 4), function 500 (FIG. 5), function 600 (FIG. 6), and/or function 700 (FIG. 7)). In a number of embodiments, the ordinary power consumption changes can be the turning on or turning off of appliances in the home that is not dependent on or affected by calibration of the sensing device. In various embodiments, block 1301 can include iteratively predicting the first transfer function by the one or more processing modules based at least in part on (a) measured regions of magnetic flux measured by the sensing device before and after the load unit of the calibration device applies a load and (b) extrapolated regions outside the measured regions. The measured regions can be similar or identical to regions 403 (FIG. 4), 502 (FIGS. 5, 7), 602 (FIG. 6), 604 (FIG. 6), and/or 704 (FIG. 7). The extrapolated regions can be similar or identical to regions 403 (FIG. 4), 501 (FIGS. 5-7), 603 (FIG. 6), and/or 703 (FIG. 7). In various embodiments block 1301 can be perform at least in part by neural network module 222 (FIGS. 2-3) and/or transfer function module 229 (FIGS. 2-3). In some embodiments, the first time period can be at least 48 hours. In other embodiments, the first time period can be greater than or less than 48 hours. For example, the first time period can be the amount of time required to calibrate at least a predetermined percentage of the first transfer function over the range of possible usage in the structure.

In certain embodiments, the load unit of the calibration device can be configured to provide a maximum load of no more than 1000 W. In other embodiments, the load unit of the calibration device can be configured to provide a maximum load of no more than 300 W. In yet other embodiments, the load unit of the calibration device can be configured to provide a maximum load of no more than another suitable wattage. In various embodiments, the load unit of the calibration unit can be configured to draw no more than four discrete loads. For example, the load unit can be configured to draw 25 W, 100 W, 200 W, and 300 W loads. In other embodiments, the load unit of the calibration unit can be configured to draw no more than one, two, three, five, six, seven, eight, or another suitable number of discrete loads.

In various embodiments, the load unit of the calibration device can be configured to draw a range of loads. For example, the load unit can be configured in some cases to draw a range of loads of 300 W, such as from 0 W to 300 W. In some embodiments, after the sensing device is calibrated, the one or more processing modules can be configured to use the sensing device to determine a range of power consumption measurements. For example, the sensing device can be calibrated in some cases to sense a range of power consumption measurements of 10 kW, such as from 0 W to 10 kW. In a number of embodiments, the range of loads can be less than the range of power consumption measurements. In some embodiments, the range of loads can be less than 20% of the range of power consumption measurements. In other embodiments, the range of loads can be less than 10% of the range of power consumption measurements. In yet other embodiments, the range of loads can be less than 5% or another suitable percentage of the range of power consumption measurements.

In some embodiments, block 1301 of automatically calibrating the sensing device by determining a first transfer function in a piecewise manner based on a plurality of ordinary power consumption changes in the structure over a first time period can include a block 1302 of training a neural network model upon sensing a triggering event corresponding to the plurality of ordinary power consumption changes to determine a second transfer function converting a magnetic field change measurement to a current change value. In many embodiments, the neural network model can be trained by neural network module 222 (FIGS. 2-3), as described above. In several embodiments, the triggering events can based on the ordinary power consumption changes which result in a sensed magnetic field within one or the extrapolated regions. In various embodiments, the second transfer function can be similar or identical to predicted function 401 (FIG. 4). In many embodiments, the second transfer function can be learned by neural network module 222 (FIGS. 2-3). In a number of embodiments, the block 1302 can be implemented as shown in FIG. 14 and described below.

In some embodiments, block 1301 of automatically calibrating the sensing device by determining a first transfer function in a piecewise manner based on a plurality of ordinary power consumption changes in the structure over a first time period can include a block 1303 of updating the first transfer function with the one or more processing modules based at least in part on the second function. In many embodiments, the first transfer function can be configured to convert a magnetic field measurement to an absolute current value. In several embodiments, transfer function module 229 (FIGS. 2-3) can update the first transfer function based at least in part on the second function, such as shown in FIGS. 4-7 and described above.

In some embodiments, method 1300 can further include a block 1304 of determining a power consumption measurement using the one or more processing modules based on one or more output signals of the sensing device and the first transfer function. The one or more output signals of the sensing device can be similar or identical to output signals $S_1$, $S_2$, $S_3$, and/or $S_4$, as measured by magnetic field sensors 111-114 (FIGS. 1-3), respectively. In some embodiments, block 1304 can include determining a phase difference between an electrical current flowing in the one or more main electrical power supply lines and a voltage of the one or more main electrical power supply lines. In some embodiments, the phase difference can be calculated by phase angle module 228 (FIGS. 2-3), as described above. In some embodiments, block 1304 can include determining a real power usage based at least in part on the phase difference. In many embodiments, the power consumption measurement and/or real power usage can be computed by power computation module 227 (FIGS. 2-3), as described above.

Figure 14:
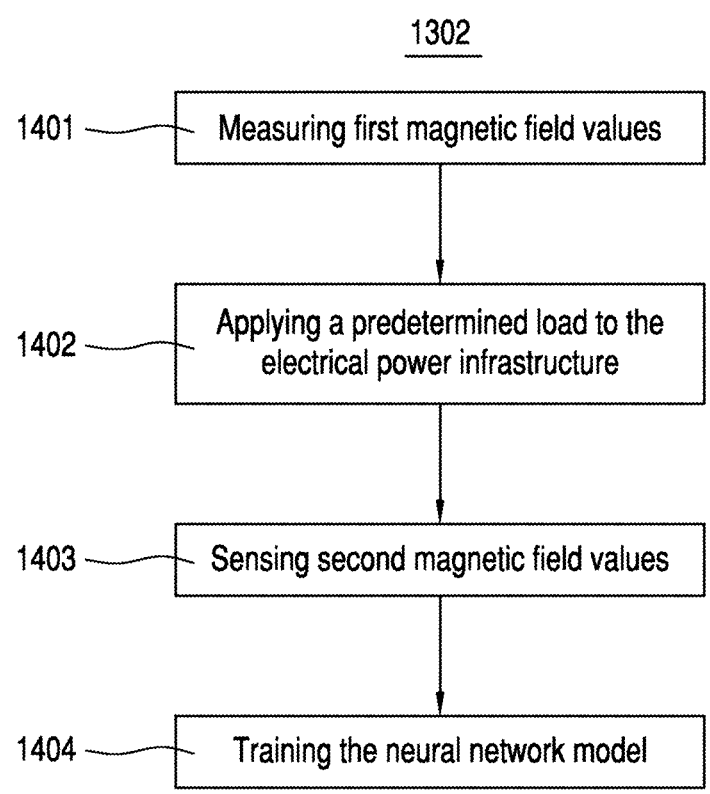
FIG. 14 illustrates a flow chart for a method of training the neural network model upon sensing the triggering event, according to the embodiment of FIG. 13.

Turning to the next drawing, FIG. 14 illustrates a flow chart for an embodiment of a block 1302 of training the neural network model upon sensing the triggering event. Block 1302 is merely exemplary and is not limited to the embodiments presented herein. Block 1302 can be employed in many different embodiments or examples not specifically depicted or described herein. In some embodiments, the procedures, the processes, and/or the activities of block 1302 can be performed in the order presented. In other embodiments, the procedures, the processes, and/or the activities of the block 1302 can be performed in any other suitable order. In still other embodiments, one or more of the procedures, the processes, and/or the activities in block 1302 can be combined or skipped.

Referring to FIG. 14, block 1302 can include a block 1401 of upon sensing a first change in magnetic flux corresponding to the triggering event, measuring one or more first magnetic field values from the sensing device. In many embodiments, the first change in magnetic flux corresponding to the triggering event can be sensed by the magnetic field sensors. In a number of embodiments, the magnetic field sensors can measure the first magnetic field values, which can be similar or identical to $S_{1p}$, $S_{2p}$, $S_{3p}$, and/or $S_{4p}$, as described above. In various embodiments, the triggering events can include ordinary power consumption changes in which the one or more first magnetic field values measured from the sensing device correspond to an extrapolated region of the first transfer function. For example, the extrapolated regions can be similar or identical to regions 403 (FIG. 4), 501 (FIGS. 5-7), 603 (FIG. 6), and/or 703 (FIG. 7).

In some embodiments, block 1302 additionally can include a block 1402 of applying a predetermined load of the load unit of the calibration device to the electrical power infrastructure, the predetermined load drawing a first current amount. The first current amount can be similar or identical to $I_{ch}$, as described above.

In various embodiments, block 1302 further can include a block 1403 of sensing one or more second magnetic field values of the sensing device while the predetermined load is applied to the electrical power infrastructure. In a number of embodiments, the magnetic field sensors can measure the second magnetic field values, which can be similar or identical to $S_{1c}$, $S_{2c}$, $S_{3c}$, and/or $S_{4c}$.

In some embodiments, block 1302 additionally can include a block 1404 of using the one or more processing modules to train the neural network model using the one or more first magnetic field values and the one or more second magnetic field values as an input layer of the neural network model, and the first current amount as an output layer of the neural network model. For example, the neural network model can be trained using neural network module 222, as described above.

Figure 15:
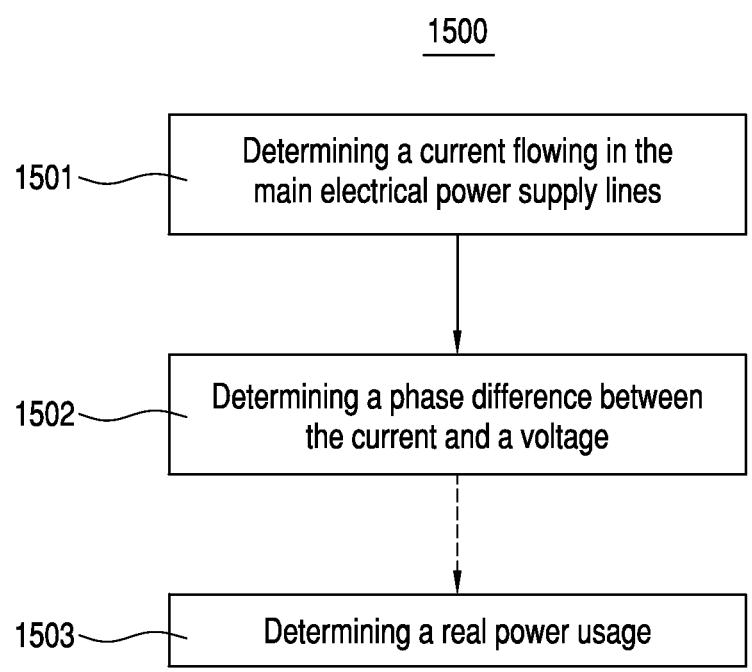
FIG. 15 illustrates a flow chart for a sensing electrical power being provided to a structure using a sensing device, a calibration device, and one or more processing modules, according to another embodiment.

Turning to the next drawing, FIG. 15 illustrates a flow chart for an embodiment of a method 1500 of sensing electrical power being provided to a structure using a sensing device, a calibration device, and one or more processing modules. Method 1500 is merely exemplary and is not limited to the embodiments presented herein. Method 1500 can be employed in many different embodiments or examples not specifically depicted or described herein. In some embodiments, the procedures, the processes, and/or the activities of method 1500 can be performed in the order presented. In other embodiments, the procedures, the processes, and/or the activities of the method 1500 can be performed in any other suitable order. In still other embodiments, one or more of the procedures, the processes, and/or the activities in method 1500 can be combined or skipped.

In some embodiments, the sensing device can be similar or identical to sensing device 110 (FIGS. 1-3, 12). In a number of embodiments, the calibration device can be similar or identical to calibration device 180 (FIGS. 1-2, 12) or calibration device 380 (FIG. 3). In many embodiments, the one or more processing modules can be similar or identical to processing module 225 (FIGS. 2-3). In a number of embodiments, the sensing device can be attached to a panel of a circuit breaker box. For example, the panel can be similar or identical to panel 196 (FIGS. 1, 12), and the circuit breaker box can be similar or identical to circuit breaker panel 190 (FIGS. 1, 12). In various embodiments, the panel of the circuit breaker box can overlie at least a part of one or more main electrical power supply lines for an electrical power infrastructure of a structure. For example, the one or more main electrical power supply lines can be similar or identical to main electrical power conductors 193, 194, and/or 195 (FIG. 1). The electrical power infrastructure can be similar or identical to electrical power infrastructure 160 (FIGS. 1, 12). In some embodiments, the calibration device can include a load unit. The load unit can be similar or identical to load unit 281 (FIGS. 2-3).

Referring to FIG. 15, method 1500 can include a block 1501 of determining a current flowing in the one or more main electrical power supply lines based at least in part on one or more output signals of the sensing device. in various embodiments, the output signals can be similar or identical to output signals $S_1$, $S_2$, $S_3$, and/or $S_4$, as measured by magnetic field sensors 111-114 (FIGS. 1-3), respectively. In various embodiments, the sensing device can include one or more magnetic field sensors. The magnetic field sensors can be similar or identical to magnetic field sensors 111-114 (FIGS. 1-3). In several embodiments, the magnetic field sensors can be configured to measure a magnetic flux produced by at least a part of the one or more main electrical power supply lines and generate the one or more output signals of the sensing device based on the magnetic flux measured by the sensing device. In a number of embodiments, the sensing device can be devoid of being electrically or physically coupled to the one or more main electrical power supply lines. For example, the sensing device can be uncoupled, whether directly or indirectly, to any of the main electrical power supply lines.

In some embodiments, method 1500 additionally can include a block 1502 of determining a phase difference between the current flowing in the one or more main electrical power supply lines and a voltage of the one or more main electrical power supply lines measured by the calibration unit. In various embodiments, the calibration device can be electrically coupled to the electrical power infrastructure of the structure. For example, the calibration device can be electrical coupled such as via electrical plug 282 (FIGS. 2-3). In some embodiments, block 1502 can include determining a phase of the current based on a phase of the magnetic flux measured by the sensing device. For example, the phase can be calculated by phase angle module 228 (FIGS. 2-3), as described above.

In some embodiments, method 1500 can optionally include a block 1503 of determining a determining a real power usage based at least in part on the phase difference. In many embodiments, the real power usage can be computed by power computation module 227 (FIGS. 2-3), as described above.

Figure 16:
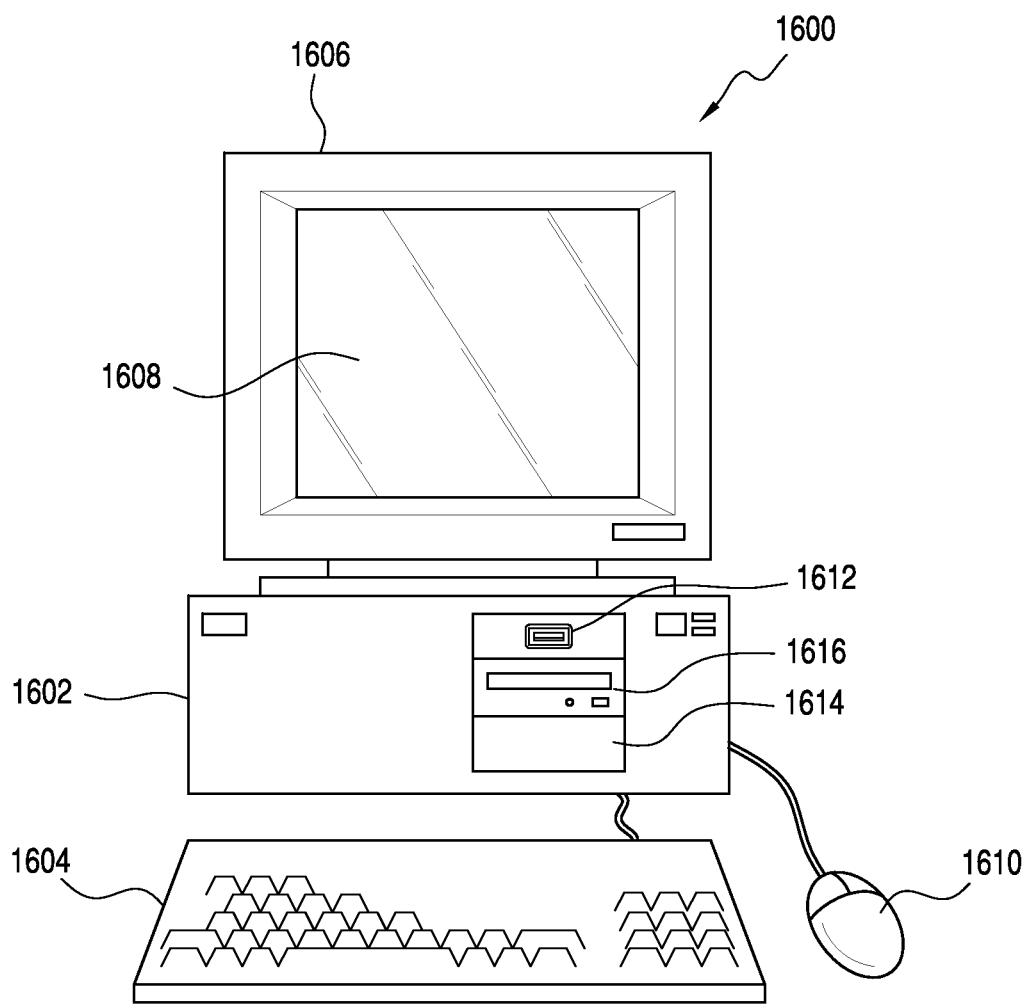
FIG. 16 illustrates a front elevational view of a computer system that is suitable for implementing an embodiment of the systems of FIGS. 1-3.
Figure 17:
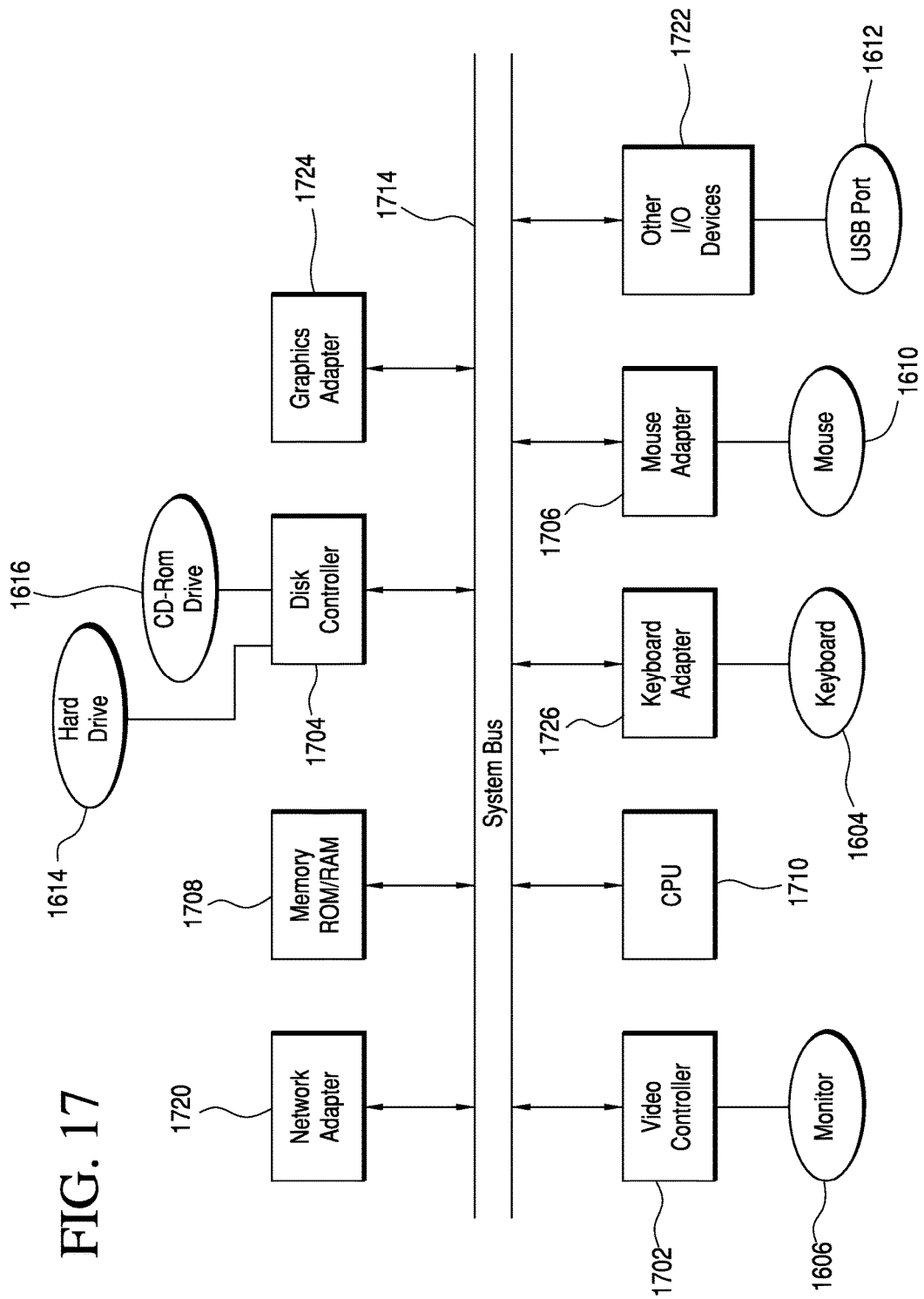
FIG. 17 illustrates a representative block diagram of an example of the elements included in the circuit boards inside a chassis of the computer system of FIG. 16.

Turning ahead in the drawings, FIG. 16 illustrates an exemplary embodiment of computer system 1600, all of which or a portion of which can be suitable for implementing the techniques described above. As an example, a different or separate one of chassis 1602 (and its internal components) can be suitable for implementing the techniques described above. Furthermore, one or more elements of computer system 1600 (e.g., refreshing monitor 1606, keyboard 1604, and/or mouse 1610, etc.) can also be appropriate for implementing the techniques described above. Computer system 1600 comprises chassis 1602 containing one or more circuit boards (not shown), Universal Serial Bus (USB) port 1612, Compact Disc Read-Only Memory (CD-ROM) and/or Digital Video Disc (DVD) drive 1616, and hard drive 1614. A representative block diagram of the elements included on the circuit boards inside chassis 1602 is shown in FIG. 17. Central processing unit (CPU) 1710 in FIG. 17 is coupled to system bus 1714 in FIG. 17. In various embodiments, the architecture of CPU 1710 can be compliant with any of a variety of commercially distributed architecture families.

Continuing with FIG. 17, system bus 1714 also is coupled to memory storage unit 1708, where memory storage unit 1708 comprises both read only memory (ROM) and random access memory (RAM). Non-volatile portions of memory storage unit 1708 or the ROM can be encoded with a boot code sequence suitable for restoring computer system 1600 (FIG. 16) to a functional state after a system reset. In addition, memory storage unit 1708 can comprise microcode such as a Basic Input-Output System (BIOS). In some examples, the one or more memory storage units of the various embodiments disclosed herein can comprise memory storage unit 1708, a USB-equipped electronic device, such as, an external memory storage unit (not shown) coupled to universal serial bus (USB) port 1612 (FIGS. 16-17), hard drive 1614 (FIGS. 16-17), and/or CD-ROM or DVD drive 1616 (FIGS. 16-17). In the same or different examples, the one or more memory storage units of the various embodiments disclosed herein can comprise an operating system, which can be a software program that manages the hardware and software resources of a computer and/or a computer network. The operating system can perform basic tasks such as, for example, controlling and allocating memory, prioritizing the processing of instructions, controlling input and output devices, facilitating networking, and managing files. Some examples of common operating systems can comprise Microsoft® Windows® operating system (OS), Mac® OS, UNIX® OS, and Linux® OS.

As used herein, "processor" and/or "processing module" means any type of computational circuit, such as but not limited to a microprocessor, a microcontroller, a controller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions. In some examples, the one or more processors of the various embodiments disclosed herein can comprise CPU 1710.

In the depicted embodiment of FIG. 17, various I/O devices such as disk controller 1704, graphics adapter 1724, video controller 1702, keyboard adapter 1726, mouse adapter 1706, network adapter 1720, and other I/O devices 1722 can be coupled to system bus 1714. Keyboard adapter 1726 and mouse adapter 1706 are coupled to keyboard 1604 (FIGS. 16-17) and mouse 1610 (FIGS. 16-17), respectively, of computer system 1600 (FIG. 16). While graphics adapter 1724 and video controller 1702 are indicated as distinct units in FIG. 17, video controller 1702 can be integrated into graphics adapter 1724, or vice versa in other embodiments. Video controller 1702 is suitable for refreshing monitor 1606 (FIGS. 16-17) to display images on a screen 1608 (FIG. 16) of computer system 1600 (FIG. 16). Disk controller 1704 can control hard drive 1614 (FIGS. 16-17), USB port 1612 (FIGS. 16-17), and CD-ROM drive 1616 (FIGS. 16-17). In other embodiments, distinct units can be used to control each of these devices separately.

In some embodiments, network adapter 1720 can comprise and/or be implemented as a WNIC (wireless network interface controller) card (not shown) plugged or coupled to an expansion port (not shown) in computer system 1600 (FIG. 16). In other embodiments, the WNIC card can be a wireless network card built into computer system 1600 (FIG. 16). A wireless network adapter can be built into computer system 1600 by having wireless communication capabilities integrated into the motherboard chipset (not shown), or implemented via one or more dedicated wireless communication chips (not shown), connected through a PCI (peripheral component interconnector) or a PCI express bus of computer system 1600 (FIG. 16) or USB port 1612 (FIG. 16). In other embodiments, network adapter 1720 can comprise and/or be implemented as a wired network interface controller card (not shown).

Although many other components of computer system 1600 (FIG. 16) are not shown, such components and their interconnection are well known to those of ordinary skill in the art. Accordingly, further details concerning the construction and composition of computer system 1600 and the circuit boards inside chassis 1602 (FIG. 16) are not discussed herein.

When computer system 1600 in FIG. 16 is running, program instructions stored on a USB-equipped electronic device connected to USB port 1612, on a CD-ROM or DVD in CD-ROM and/or DVD drive 1616, on hard drive 1614, or in memory storage unit 1708 (FIG. 17) are executed by CPU 1710 (FIG. 17). A portion of the program instructions, stored on these devices, can be suitable for carrying out at least part of the techniques described above.

Although computer system 1600 is illustrated as a desktop computer in FIG. 16, there can be examples where computer system 1600 may take a different form factor while still having functional elements similar to those described for computer system 1600. In some embodiments, computer system 1600 may comprise a single computer, a single server, or a cluster or collection of computers or servers, or a cloud of computers or servers. Typically, a cluster or collection of servers can be used when the demand on computer system 1600 exceeds the reasonable capability of a single server or computer. In certain embodiments, computer system 1600 may comprise a portable computer, such as a laptop computer. In certain other embodiments, computer system 1600 may comprise a mobile device, such as a smart phone. In certain additional embodiments, computer system 1600 may comprise an embedded system.

In many embodiments, the systems and methods described herein present a significant improvement over past work on non-contact end-user deployable sensor for real time whole home power consumption. The techniques described can allow users to place a single device consisting of magnetic pickups on the outside of a power or breaker panel to infer whole home power consumption without the need for professional installation of current transformers. This approach advantageously does not require precise placement on the breaker panel, which was a key requirement in previous approaches. By being independent of sensor placement, the techniques described here can greatly reduces the installation effort required by end users.

This approach can beneficially be enabled through a self-calibration technique using a neural network that dynamically learns the transfer function despite the placement of the sensor and the construction of the breaker panel itself. This approach advantageously can have the ability to infer real-time absolute real power consumption in a structure, based on the capability of predicting the absolute current waveform, unlike past solutions that have only been able to capture apparent power.

In many embodiments, the self-calibrating techniques described herein can dynamically generates a multi-order transfer function between the magnetic sensors and the actual current across the entire range of power use in the home. Instead of mathematically modeling the transfer function a priori, the systems and methods described herein can use a learning approach to generate this transfer function for each home, which can be less susceptible to differences in breaker panel design and construction. Further, this approach can remove the need for precise placement of the sensor because it can takes into account "interference" from any branch circuits. Because of the in situ dynamic model, the systems described herein can be not limited to perfect placement of sensors.

In many embodiments, the techniques described here can beneficially use a calibration device with a much smaller range (0-300 W) than past approaches by leveraging the use of the natural electrical activity of a home throughout the day as a part of the self-calibration sequence. The natural household electrical activities can advantageously be leveraged throughout the day to generate a transfer function for the entire range of power use in the home.

In several embodiments, this approach can advantageously have the ability to predict the phase angle between the current and voltage to infer true power, which is equivalent to predicting the waveform itself and not just the magnitude. In many embodiments, the phase angle can advantageously be calculated using a single set of magnetic sensors. In a number of embodiments, the self-calibrating approach beneficially does not require precise placement of the sensor on the breaker panel and uses the actual power use throughout a day for calibration. In some embodiments, a neural network-based learning approach can beneficially dynamically generate a multi-order magnetic sensor transfer function.

In many embodiments, the high accuracy of the systems, method, techniques, and approaches described herein can be ideal for many applications such as energy disaggregation, activity inference, and eco-feedback while reducing the barrier to entry by greatly simplifying the installation process. Further, the approximately 5% maximum error in these approaches is much better than the commonly used IEEE C57.13 C-class CTs (rated for <=10% error). Moreover, their rated error for such CTs is generally at a low current level. At higher current (e.g., >2 A, which is usually expected in a whole-borne scenario), the error rates are much higher. Very expensive CTs with 1-2% error are used in specialized applications such as precision current measurements. But, as described above, CTs require installation with access to the current-carrying conductors. The systems and method described herein can advantageously allow researchers in the energy disaggregation community to easily access power data in a home without the need for professional installation.

In several embodiments, the approach described herein can beneficially be used to automatically calibrate a stick-on real-power meter, which can be installed by the homeowner without manual calibration. To assess the energy viability of using the self-calibration approach, the energy dissipated by the calibrator across all of our deployments was calculated to be 0.181 kWh on average per home for the calibration to converge on the full transfer function. In some embodiments, the system can be calibrated each time the consumption falls into an un-calibrated region. In other embodiments, the system can be calibrated only when the consumption falls outside a threshold region.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that various elements of FIGS. 1-17 may be modified, combined, and/or interchanged, and that the foregoing discussion of certain of these embodiments does not necessarily represent a complete description of all possible embodiments. As another example, one or more of the procedures, processes, or activities of FIGS. 13-15 may include different procedures, processes, and/or activities and be performed in many different orders.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A system for sensing electrical power usage in an electrical power infrastructure of a structure, the structure comprising a circuit breaker box and one or more main electrical power supply lines for the electrical power infrastructure of the structure, the system comprising:
   a sensing device configured to be attached to a panel of the circuit breaker box overlying at least part of the one or more main electrical power supply lines, the sensing device comprising one or more magnetic field sensors;
   a calibration device configured to be electrically coupled to the electrical power infrastructure of the structure, the calibration device comprising a load unit; and
   one or more processing modules configured to receive one or more output signals from the sensing device,
   wherein:
      the sensing device is devoid of being electrically or physically coupled to the one or more main electrical power supply lines or the electrical power infrastructure when the sensing device is attached to the panel;
      the one or more processing modules are further configured to determine the electrical power usage when the sensing device is coupled at any location over the panel, based at least in part on the one or more output signals received from the sensing device;
      the load unit of the calibration device is configured to draw a range of loads;
      the one or more processing modules are configured to use the sensing device to determine a range of the electrical power usage; and
      the range of loads is less than the range of the electrical power usage.

2. The system of claim 1, wherein:
   the one or more processing modules are further configured to determine the electrical power usage when the sensing device is devoid of being located over the one or more main electrical power supply lines, is devoid of being located over one or more branch electrical power lines that are electrically coupled to the one or more main electrical power supply lines, and is devoid of being located over one or more branch circuit breakers that are electrically coupled to the one or more branch electrical power lines.

3. The system of claim 1, wherein:
   the one or more processing modules are further configured to determine the electrical power usage when the sensing device is devoid of being located at a predetermined location over the panel.

4. The system of claim 1, wherein:
the load unit of the calibration device is configured to provide a maximum load of no more than 1000 watts.

5. The system of claim 1, wherein:
the load unit of the calibration device is configured to provide a maximum load of no more than 300 watts.

6. The system of claim 1, wherein:
the one or more processing modules are further configured to determine a phase difference between an electrical current flowing in the one or more main electrical power supply lines and a voltage of the one or more main electrical power supply lines.

7. The system of claim 6, wherein:
the one or more processing modules are further configured to determine a real power usage based at least in part on the phase difference.

8. The system of claim 7, wherein:
the sensing device further comprises one or more magnets surrounding the one or more magnetic field sensors, the one or more magnets configured to saturate a magnetic field induced by the panel.

9. The system of claim 1, wherein:
the load unit of the calibration device is configured to draw no more than four discrete loads.

10. The system of claim 1, wherein:
the range of loads is less than 20% of the range of the electrical power usage.

11. A method of providing a system for sensing electrical power usage in an electrical power infrastructure of a structure, the structure comprising a circuit breaker box and one or more main electrical power supply lines for the electrical power infrastructure of the structure, the method comprising:
providing a sensing device configured to be attached to a panel of the circuit breaker box overlying at least part of the one or more main electrical power supply lines, the sensing device comprising one or more magnetic field sensors;
providing a calibration device configured to be electrically coupled to the electrical power infrastructure of the structure, the calibration device comprising a load unit; and
providing one or more processing modules configured to receive one or more output signals from the sensing device,
wherein:
the sensing device is devoid of being electrically or physically coupled to the one or more main electrical power supply lines or the electrical power infrastructure when the sensing device is attached to the panel;
the one or more processing modules are further configured to determine the electrical power usage when the sensing device is coupled at any location over the panel, based at least in part on the one or more output signals received from the sensing device;
the load unit of the calibration device is configured to draw a range of loads;
the one or more processing modules are configured to use the sensing device to determine a range of the electrical power usage; and
the range of loads is less than the range of the electrical power usage.

12. The method of claim 11, wherein:
providing the one or more processing modules comprises providing the one or more processing modules to be further configured to determine the electrical power usage when the sensing device is devoid of being located over the one or more main electrical power supply lines, is devoid of being located over one or more branch electrical power lines that are electrically coupled to the one or more main electrical power supply lines, and is devoid of being located over one or more branch circuit breakers that are electrically coupled to the one or more branch electrical power lines.

13. The method of claim 11, wherein:
providing the one or more processing modules comprises providing the one or more processing modules to be further configured to determine the electrical power usage when the sensing device is devoid of being located at a predetermined location over the panel.

14. The method of claim 11, wherein:
providing the calibration device comprises providing the load unit of the calibration device to be configured to provide a maximum load of no more than 1000 watts.

15. The method of claim 11, wherein:
providing the calibration device comprises providing the load unit of the calibration device to be configured to provide a maximum load of no more than 300 watts.

16. The method of claim 11, wherein:
providing the one or more processing modules comprises providing the one or more processing modules to be further configured to determine a phase difference between an electrical current flowing in the one or more main electrical power supply lines and a voltage of the one or more main electrical power supply lines.

17. The method of claim 16, wherein:
providing the one or more processing modules comprises providing the one or more processing modules to be further configured to determine a real power usage based at least in part on the phase difference.

18. The method of claim 17, wherein:
providing the sensing device further comprises providing one or more magnets surrounding the one or more magnetic field sensors, the one or more magnets configured to saturate a magnetic field induced by the panel.

19. The method of claim 11, wherein:
providing the calibration device comprises providing the load unit of the calibration device to be configured to draw no more than four discrete loads.

20. The method of claim 11, wherein:
the range of loads is less than 20% of the range of the electrical power usage.

* * * * *